US012750998B2

(12) United States Patent
Lee et al.

(10) Patent No.: US 12,750,998 B2
(45) Date of Patent: Sep. 29, 2026

(54) SEMICONDUCTOR DEVICE

(71) Applicant: Samsung Electronics Co., Ltd., Suwon-si (KR)

(72) Inventors: Donggeon Lee, Suwon-si (KR); Jungoo Kang, Suwon-si (KR); Dayeon Nam, Suwon-si (KR); Juwon Park, Suwon-si (KR); Sungjoon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 551 days.

(21) Appl. No.: 18/332,876

(22) Filed: Jun. 12, 2023

(65) Prior Publication Data

US 2023/0413526 A1 Dec. 21, 2023

(30) Foreign Application Priority Data

Jun. 16, 2022 (KR) ........................ 10-2022-0073469

(51) Int. Cl.
*H10B 12/00* (2023.01)

(52) U.S. Cl.
CPC ......... *H10B 12/315* (2023.02); *H10B 12/033* (2023.02)

(58) Field of Classification Search
CPC ........ H01G 4/33; H01G 4/008; H01G 4/1254; H01G 9/0032; H01G 4/12; C23C 14/3407; C23C 14/352; C23C 16/405
See application file for complete search history.

(56) References Cited

U.S. PATENT DOCUMENTS

2011/0057292 A1* 3/2011 Hu ......................... H10D 1/665 257/532
2014/0027883 A1 1/2014 Hu
2016/0358998 A1* 12/2016 Lim ..................... H10B 12/033
2019/0165088 A1 5/2019 Cho et al.
2019/0355806 A1 11/2019 Kang et al.
2020/0058731 A1 2/2020 Mun et al.
(Continued)

FOREIGN PATENT DOCUMENTS

KR 20190062031 A 6/2019
KR 20200019553 A 2/2020
(Continued)

OTHER PUBLICATIONS

"Extended European Search Report dated Nov. 16, 2023, issued in corresponding European Application No. 23179280.5, 8 pages".

*Primary Examiner* — Edward Chin
(74) *Attorney, Agent, or Firm* — Wolf, Greenfield & Sacks, P.C.

(57) ABSTRACT

A semiconductor device includes a lower structure, first electrodes spaced apart from each other on the lower structure, a second electrode on the first electrodes, and a dielectric layer between the first electrodes and the second electrode. Each of the first electrodes includes a first element, a second element, and nitrogen (N). A degree of stiffness of a first nitride material including the first element is higher than a degree of stiffness of a second nitride material including the second element. Each of the first electrodes includes a region in which a ratio of a concentration of the first element in the region to a concentration of the second element in the region decreases in a horizontal direction, away from a side surface of each of the first electrodes.

20 Claims, 20 Drawing Sheets

1

(56) References Cited

U.S. PATENT DOCUMENTS

| | | | |
|---|---|---|---|
| 2020/0312952 | A1 | 10/2020 | Cho et al. |
| 2020/0395436 | A1 | 12/2020 | Jung et al. |
| 2020/0395438 | A1 | 12/2020 | Kang et al. |
| 2021/0384194 | A1 | 12/2021 | Woo et al. |
| 2021/0408225 | A1 | 12/2021 | Seo et al. |
| 2022/0037325 | A1 | 2/2022 | Kang et al. |
| 2022/0140067 | A1 | 5/2022 | Song et al. |

FOREIGN PATENT DOCUMENTS

| | | | |
|---|---|---|---|
| KR | 20200141809 | A | 12/2020 |
| KR | 20200145871 | A | 12/2020 |
| KR | 20210150214 | A | 12/2021 |
| KR | 20220001214 | A | 1/2022 |
| KR | 20220059878 | A | 5/2022 |

* cited by examiner

15{17a, 17b, 17c} 23{25, 27} 25{25a, 25b, 25c, 25d} 27{27a, 27b, 27c} 42{43, 46, 49} TR{17a, 17b, 9a, 9b} CAP{80, 85, 90}

SEMICONDUCTOR DEVICE

CROSS-REFERENCE TO RELATED APPLICATION(S)

This application claims benefit of priority to Korean Patent Application No. 10-2022-0073469 filed on Jun. 16, 2022 in the Korean Intellectual Property Office, the disclosure of which is incorporated herein by reference in its entirety.

BACKGROUND

Example embodiments relate to a semiconductor device and a method of manufacturing the semiconductor device.

Research has been conducted to reduce the size of elements of a semiconductor device and to improve performance of the semiconductor device. For example, in memory devices such as DRAMs, research has been conducted to reliably and stably form elements having reduced sizes.

SUMMARY

Example embodiments provide a semiconductor device having a high degree of integration.

Example embodiments provide a method of manufacturing the semiconductor device.

According to example embodiments, a semiconductor device may include a lower structure, first electrodes spaced apart from each other on the lower structure, a second electrode on the first electrodes, and a dielectric layer between the first electrodes and the second electrode. Each of the first electrodes may include a first element, a second element, and nitrogen (N). A degree of stiffness of a first nitride material including the first element may be higher than a degree of stiffness of a second nitride material including the second element. Each of the first electrodes may include a region in which a ratio of a concentration of the first element in the region to a concentration of the second element in the region decreases in a horizontal direction, away from a side surface of each of the first electrodes. The horizontal direction may be parallel to an upper surface of the lower structure.

According to example embodiments, a semiconductor device may include a lower structure, a first electrode on the lower structure, a second electrode on the first electrode, and a dielectric layer between the first electrode and the second electrode. The first electrode may include a first region including at least a titanium (Ti) element, a niobium (Nb) element, and a nitrogen (N) element. In the first region of the first electrode, a concentration of the Nb element may increase in a horizontal direction, away from a side surface of the first electrode.

According to example embodiments, a semiconductor device may include a lower structure, a first electrode on the lower structure, a second electrode on the first electrode, and a dielectric layer between the first electrode and the second electrode. The first electrode may include a first region including at least three elements. The first region of the first electrode may include a first sub-region, and a second sub-region, wherein the first sub-region is between, in a horizontal direction, the second sub-region and a side surface of the first electrode. The first sub-region may include first layers and second layers alternately stacked in the horizontal direction. The second sub-region may include third layers and fourth layers alternately stacked in the horizontal direction. The first layers and the third layers may include a same first material. The second layers and the fourth layers may include a same second material. A horizontal thickness of each of the second layers may be smaller than a horizontal thickness of each of the fourth layers.

BRIEF DESCRIPTION OF THE DRAWINGS

The above and other aspects, features, and advantages of the present inventive concept will be more clearly understood from the following detailed description, taken in conjunction with the accompanying drawings, in which.

DETAILED DESCRIPTION

Hereinafter, terms such as "upper portion," "middle portion," and "lower portion" may be replaced with other terms, for example, "first," "second," and "third" to describe components of the specification. Terms such as "first," "second,"

and "third" may be used to describe different components, but the components are not limited by the terms, and a "first component" may be referred to as a "second component."

Figure 1:
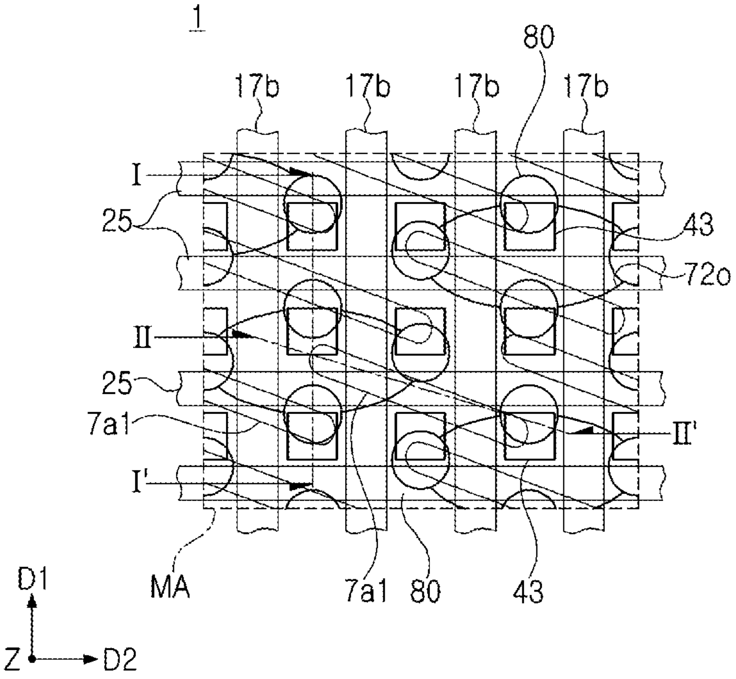
FIGS. 1, 2, 3A, and 3B are schematic diagrams illustrating a semiconductor device according to an example embodiment.
Figure 2:
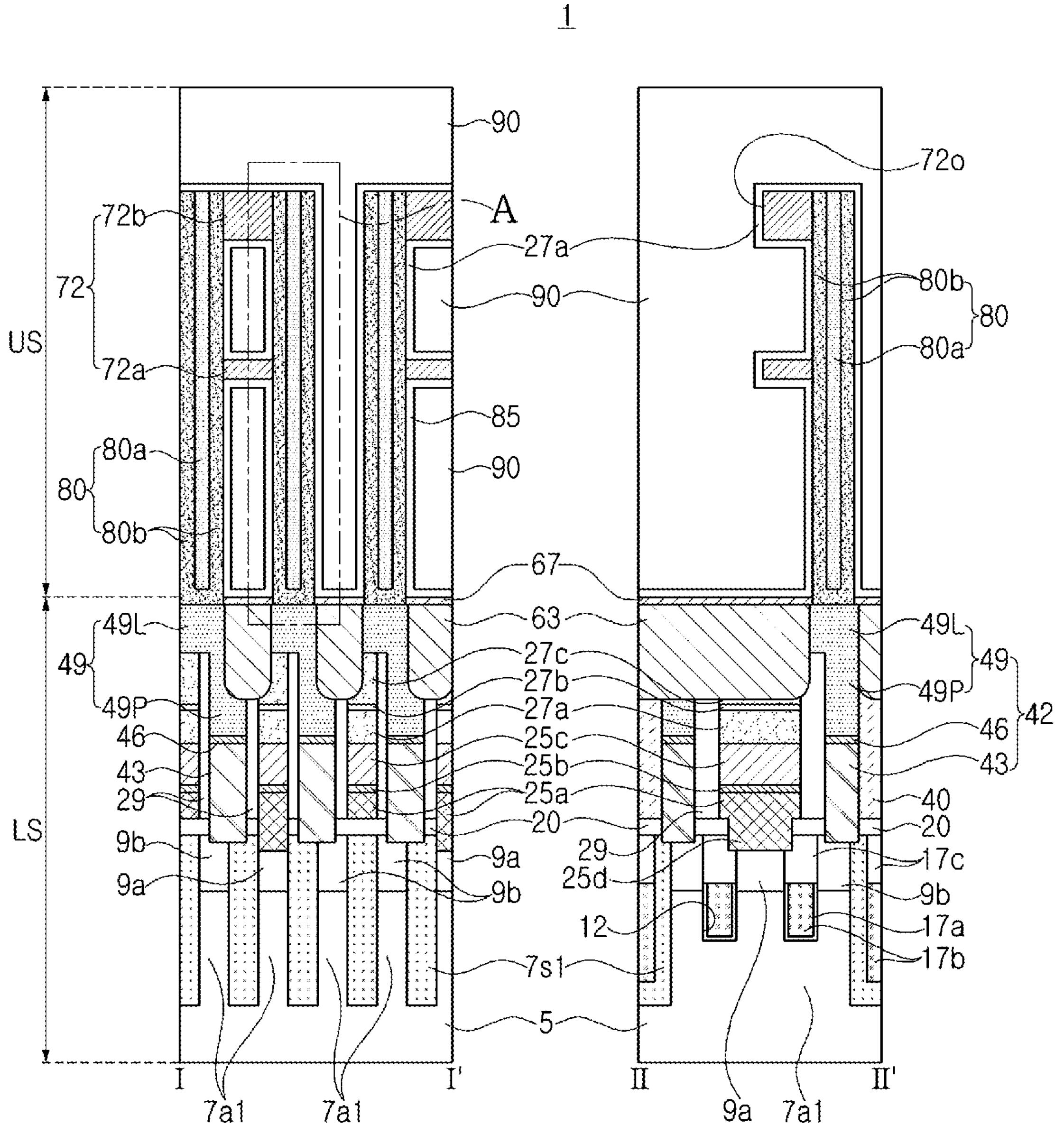

An example of a semiconductor device according to an example embodiment will be described with reference to FIGS. 1 and 2. FIGS. 1 and 2 are schematic diagrams illustrating a semiconductor device according to an example embodiment. In FIGS. 1 and 2, FIG. 1 is a schematic top view illustrating a semiconductor device according to an example embodiment, and FIG. 2 is a schematic cross-sectional view illustrating regions taken along lines I-I' and II-II' of FIG. 1.

Referring to FIGS. 1 and 2, the semiconductor device 1 according to an example embodiment may include a lower structure LS and an upper structure US on the lower structure LS.

The lower structure LS may include a substrate 5, active regions 7_a_1 disposed on the substrate 5, and an isolation region 7_s_1 defining the active regions 7_a_1.

The substrate 5 may be a semiconductor substrate. For example, the substrate may include a group IV semiconductor, a group III-V compound semiconductor, or a group II-VI compound semiconductor. For example, the group IV semiconductor may include silicon, germanium, or silicon-germanium. For example, the substrate 5 may include a silicon material, for example, a single crystal silicon material. The substrate 5 may be a substrate including a silicon substrate, a silicon on insulator (SOI) substrate, a germanium substrate, a germanium on insulator (GOI) substrate, a silicon-germanium substrate, or an epitaxial layer.

The isolation region 7_s_1 may be a trench isolation layer. The isolation region 7_s_1 may be disposed on the substrate 5 and may define side surfaces of the active regions 7_a_1. The isolation region 7_s_1 may include an insulating material such as silicon oxide and/or silicon nitride. The active regions 7_a_1 may have a shape in which the active regions 7_a_1 protrude from the substrate 5 in a vertical direction Z.

The lower structure LS may further include gate trenches 12 intersecting the active regions 7_a_1 and extending to the isolation region 7_s_1, gate structures 15 disposed in the gate trenches 12, and first impurity regions 9_a_ and second impurity regions 9_b_ disposed in the active regions 7_a_1 adjacent to side surfaces of the gate structures 15.

Each of the gate structures 15 may have a linear shape extending in a first direction D1. Each of the active regions 7_a_1 may have a bar shape extending in an oblique direction with respect to the first direction D1. One cell active region among the active regions 7_a_1 may intersect a pair of cell gate structures adjacent to each other among the gate structures 15.

In one active region 7_a_1 of the active regions 7_a_1, a pair of second impurity regions 9_b_, and one first impurity region 9_a_ between the pair of second impurity regions 9_b_ may be disposed. In one active region 7_a_1 of the active regions 7_a_1, the first and second impurity regions 9_a_ and 9_b_ may be spaced apart from each other by a pair of gate structures 15 (e.g., a pair of cell gate structures).

In example embodiments, the first impurity region 9_a_ may be referred to as a first source/drain region, and the second impurity region 9_b_ may be referred to as a second source/drain region.

Each of the gate structures 15 may include a gate dielectric layer 17_a_ conformally covering an inner wall of the gate trench 12, a gate electrode 17_b_ disposed on the gate dielectric layer 17_a_ and filing a portion of the gate trench 12, and a gate capping layer 17_c_ disposed on the gate electrode 17_b_ and filling a remaining portion of the gate trench 12.

The gate dielectric layer 17_a_, the gate electrode 17_b_, the first impurity region 9_a_, and the second impurity region 9_b_ may be included in a cell transistor.

The gate dielectric layer 17_a_ may include at least one of silicon oxide and/or a high-κ dielectric. The high-κ dielectric may include a metal oxide or a metal oxynitride. The gate electrode 17_b_ may be a word line of a memory semiconductor device such as DRAM or the like. The gate electrode 17_b_ may include doped polysilicon, a metal, a conductive metal nitride, a metal-semiconductor compound, a conductive metal oxide, conductive graphene, carbon nanotubes and/or a combination thereof. The gate capping layer 17_c_ may include an insulating material, for example, silicon nitride.

The lower structure LS may further include a buffer insulating layer 20 disposed on the active regions 7_a_1, the isolation region 7_s_1, and the gate structures 15.

The lower structure LS may further include bit line structures 23 and contact structures 42. Each of the bit line structures 23 may include a bit line 25 and a bit line capping pattern 27 sequentially stacked. The bit line 25 may have a linear shape extending in a second direction D2, perpendicular to the first direction D1. The bit line 25 may be formed of a conductive material. The bit line 25 may include a first bit line layer 25_a_, a second bit line layer 25_b_, and a third bit line layer 25_c_ sequentially stacked. For example, the first bit line layer 25_a_ may include doped silicon, for example, polysilicon having an N-type conductivity, and the second and third bit line layers 25_b_ and 25_c_ may include different conductive materials among Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, graphene, and/or carbon nanotubes.

The bit line capping pattern 27 may include a first bit line capping layer 27_a_, a second bit line capping layer 27_b_, and a third bit line capping layer 27_c_ sequentially stacked. The bit line capping pattern 27 may be formed of an insulating material. Each of the first to third bit line capping layers 27_a_, 27_b_, and 27_c_ may be formed of silicon nitride or a silicon nitride-based insulating material.

Each of the bit lines 25 may further include a bit line contact portion 25_d_ extending downward from the first bit line layer 25_a_ and electrically connected to the first impurity region 9_a_. The bit line 25 may be formed on the buffer insulating layer 20, and the bit line contact portion 25_d_ of the bit line 25 may pass through the buffer insulating layer 20 and may be in contact with the first impurity region 9_a_.

Each of the contact structures 42 includes a lower contact plug 43 passing through the buffer insulating layer 20 and electrically connecting to the second impurity region 9_b_ (e.g., the lower contact plug 43 may contact the second impurity region 9_b_), an upper contact plug 49 on the lower contact plug 43, and a metal-semiconductor compound layer 46 between the lower contact plug 43 and the upper contact plug 49. The lower contact plug 43 may include doped silicon, for example, polysilicon having an N-type conductivity. The upper contact plug 49 may include a plug portion 49P and a pad portion 49L disposed on the plug portion 49P and vertically overlapping a portion of the adjacent bit line capping pattern 27.

The lower structure LS may further include a bit line spacer 29 that is in contact with side surfaces of the bit line structure 23 and may be formed of an insulating material.

The lower structure LS may further include an insulating fence 40 in contact with the contact structures 42 between a pair of the bit line structures 23 adjacent and parallel to each other. For example, a plurality of contact structures 42 may be disposed between the pair of bit line structures 23 adjacent and parallel to each other, and the insulating fence 40 may be disposed between the contact structures 42. The insulating fence 40 may be formed of an insulating material such as silicon nitride.

The lower structure LS may further include an insulating pattern 63 passing through a space between the pad portions 49L of the contact structures 42, extending downwardly, and spaced apart from the bit lines 25. The insulating pattern 63 may be formed of an insulating material such as silicon nitride.

The lower structure LS may include an etch-stop layer 67 covering the contact structures 42 and the insulating patterns 63. For example, the etch stop layer 67 may cover an entirety of each respective upper surface of the insulating patterns 63 and at least a portion of each respective upper surface of the contact structures 42. The etch-stop layer 67 may be formed of an insulating material. For example, the etch-stop layer 67 may include at least one of a SiBN material and/or a SiCN material.

The upper structure US may further include a capacitor CAP and at least one supporter layer 72 having an opening 72*o*.

The capacitor CAP may be a capacitor of a memory cell storing data in a DRAM device. The capacitor CAP may be referred to as a data storage structure.

The capacitor CAP may include first electrodes 80, a second electrode 90 on the first electrodes 80, and a dielectric layer 85 between the first electrodes 80 and the second electrode 90. The second electrode 90 may cover an upper surface and a side surface of each of the first electrodes 80.

Each of the first electrodes 80 may include a conductive material including at least three different elements. The dielectric layer 85 may include a high-κ dielectric, silicon oxide, silicon nitride, silicon oxynitride, or a combination thereof. The second electrode 90 may include a conductive material. The conductive material of the second electrode 90 may include a doped silicon-germanium, a metal, a conductive metal nitride, a metal-semiconductor compound, a conductive metal oxide, or a combination thereof, but example embodiments are not limited to the above-described materials. The second electrode 90 may include another conductive material.

The first electrodes 80 may be in contact with and electrically connected to the pad portions 49L, may pass through the etch-stop layer 67, and may extend upward.

Each of the first electrodes 80 may have a column shape or a pillar shape, but example embodiments are not limited thereto. For example, each of the first electrodes 80 may have a cylindrical shape.

The at least one supporter layer 72 may include a lower supporter layer 72*a* and an upper supporter layer 72*b* disposed on different levels. The upper supporter layer 72*b* may be in contact with upper regions of the first electrodes 80, and may prevent the first electrodes 80 from collapsing. The lower supporter layer 72*a* may be in contact with the first electrodes 80 on a level lower than that of the upper supporter layer 72*b*, and may prevent deformation such as bending of the first electrodes 80. The at least one supporter layer 72 may include an insulating material such as silicon nitride.

In the capacitor CAP, the dielectric layer 85 may be disposed along the first electrodes 80 and surfaces of the at least one supporter layer 72 in contact with the first electrodes 80.

According to an example embodiment, the first electrode 80 may include a first element, a second element, and a third element. A degree of stiffness of a first nitride material including the first element may be higher than a degree of stiffness of a second nitride material including the second element. The first electrode 80 may include a region in which a concentration of the first element decreases and/or a concentration of the second element increases in a horizontal direction, away from side surfaces S1 and S2 of the first electrode 80. The first electrode 80 may include a region in which a ratio of a concentration of the first element in the region to a concentration of the second element in the region decreases in a horizontal direction, away from side surfaces S1 and S2 of the first electrode 80. For example, a concentration of the first element in the region may remain the same or may decrease in the horizontal direction, away from the side surfaces S1 and S2 of the first electrode 80, and a concentration of the second element in the region may increase in the horizontal direction, away from the side surfaces S1 and S2 of the first electrode 80. Here, the first nitride material including the first element may be a material having stiffness capable of minimizing deformation of the first electrode 80, and the second nitride material including the second element may be a material capable of increasing capacitance of a capacitor CAP. For example, the first element may be Ti, the second element may be Nb, the third element may be N, the first nitride material including the first element may be TiN, and the second nitride material including the second element may be NbN. Accordingly, it is possible to provide the capacitor CAP including the first electrode 80 capable of increasing capacitance while minimizing deformation, thereby increasing a degree of integration of the semiconductor device 1.

Figure 3A:
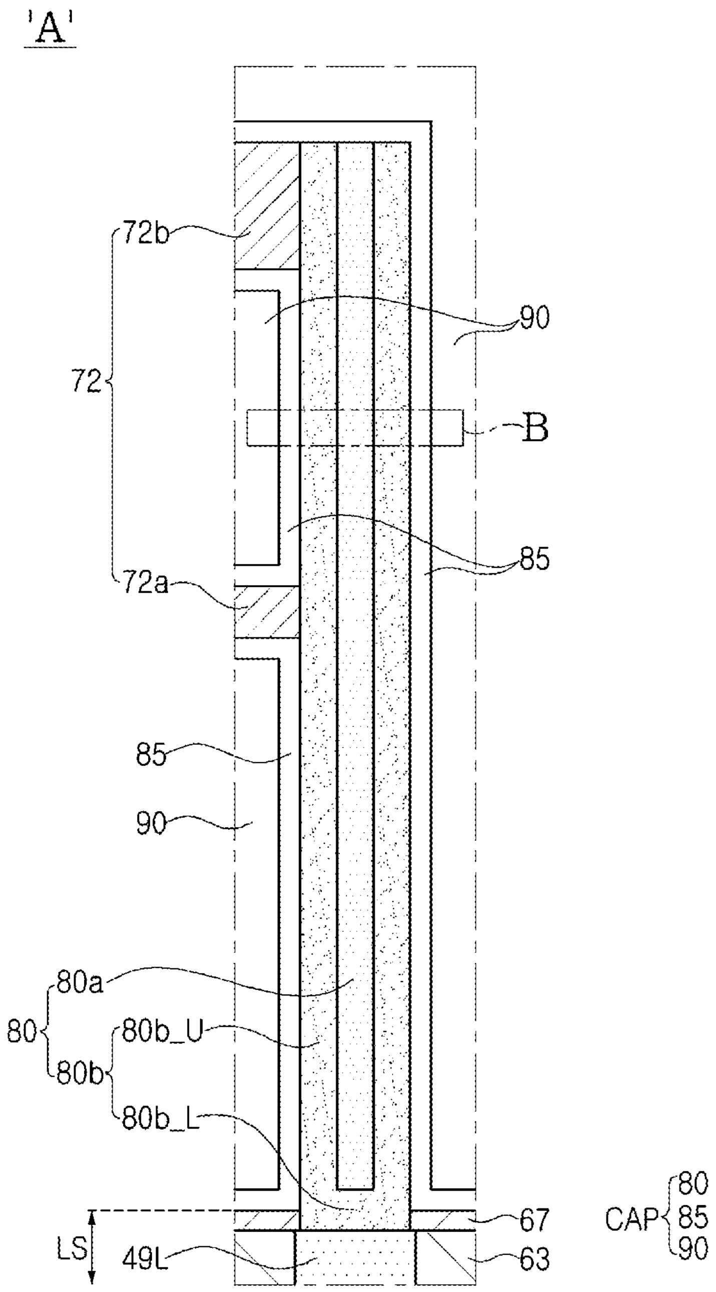

Hereinafter, an example of a semiconductor device according to an example embodiment will be described with reference to FIGS. 3A and 3B, based on one first electrode 80 of the first electrodes 80. FIG. 3A is a partially enlarged view of a region indicated by "A" of FIG. 2, and FIG. 3B is a partially enlarged view of a region indicated by "B" of FIG. 3A.

Figure 3B:
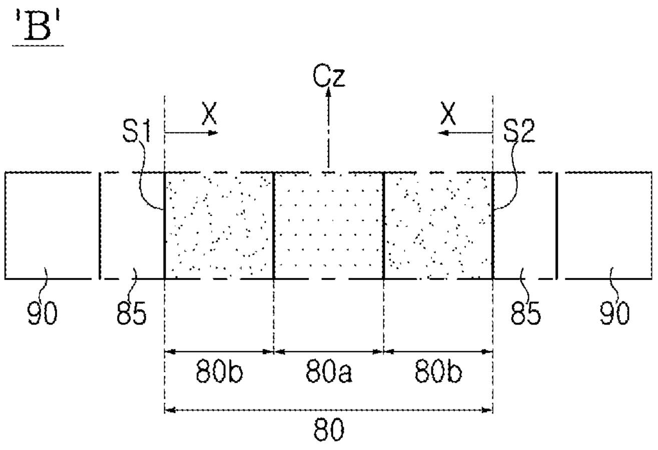

Referring to FIGS. 3A and 3B together with FIGS. 1 and 2, the first electrode 80 may include a first material region 80*a* and a second material region 80*b*.

The second material region 80*b* may include a lower portion 80*b*_L and an upper portion 80*b*_U surrounding the first material region 80*a* and extending upward from an edge region of the lower portion 80*b*_L. In a top view, the upper portion 80*b*_U of the second material region 80*b* may have a ring shape surrounding the first material region 80*a*. In the second material region 80*b*, the lower portion 80*b*_L may be in contact with the pad portion 49L.

The first electrode 80 may include a region including at least three elements. For example, the first electrode 80 may include at least a first element, a second element, and a third element.

The stiffness of the first nitride material including the first element may be higher than that of the second nitride material including the second element. For example, the first element may be a titanium (Ti) element, the second element may be a niobium (Nb) element, and the third element may be a nitrogen (N) element. The first nitride material including the first element may be a TiN material, and the second nitride material including the second element may be a NbN material.

The first material region 80*a* may include at least three elements. In the first electrode 80, the first material region 80*a* may be defined as a region including the first element, the second element, and the third element, and the second material region 80*b* may be defined as a region including the first element and the third element, and not including the second element. The first element may be Ti, the second element may be Nb, and the third element may be N. The first material region 80*a* may be referred to as a first region, and the second material region 80*b* may be referred to as a second region.

The first material region 80*a* may be a region including a material capable of increasing the capacitance of the capacitor CAP, for example, a region including Nb. In order to prevent or minimize collapse or deformation of the first electrodes 80, the second material region 80*b* may be a region including a material having a stiffness higher than that of the first material region 80*a*, for example, a region including a TiN material.

In the first material region 80*a* of the first electrode 80, the second element, for example, a Nb element, may have a concentration increasing toward a vertical central axis Cz of the first electrode 80 from a portion close to a side surface of the first electrode 80. For example, in the first material region 80*a* of the first electrode 80, the second element, for example, a Nb element, may have a concentration that increases when moving in a horizontal direction X away from side surfaces S1 and S2 of the first electrode 80 toward the vertical central axis Cz of the first electrode 80. Conversely, in the first material region 80*a*, the first element, for example, a Ti element, may have a concentration decreasing toward the vertical central axis Cz of the first electrode 80 from the portion close to the side surface of the first electrode 80. For example, in the first material region 80*a* of the first electrode 80, the first element, for example, a Ti element, may have a concentration that decreases when moving in a horizontal direction X away from side surfaces S1 and S2 of the first electrode 80 toward the vertical central axis Cz of the first electrode 80. However, example embodiments are not limited thereto. In the first material region 80*a*, the first element, for example, a Ti element, may have a concentration remaining the same toward the vertical central axis Cz of the first electrode 80 from the portion close to the side surface of the first electrode 80. For example, in the first material region 80*a* of the first electrode 80, the first element, for example, a Ti element, may have a concentration that remains substantially the same when moving in a horizontal direction X away from side surfaces S1 and S2 of the first electrode 80 toward the vertical central axis Cz of the first electrode 80.

In example embodiments, the side surface of the first electrode 80 may have a first side surface S1 and a second side surface S2 opposing each other in a horizontal direction, parallel to an upper surface of the lower structure LS. The first side surface 51 may be referred to as a first side S1, and the second side surface S2 may be referred to as a second side S2.

In example embodiments, a direction, parallel to the upper surface of the lower structure LS and toward the vertical central axis Cz of the first electrode 80 from the side surface of the first electrode 80 may be defined as a horizontal direction X. For example, the horizontal direction X may be a direction, toward the vertical central axis Cz of the first electrode 80 from the first side surface S1 of the first electrode 80, and a direction, toward the vertical central axis Cz of the first electrode 80 from the second side surface S2 of the first electrode 80.

Hereinafter, various examples of a change in concentration of the second element in the first material region 80*a* will be described with reference to FIGS. 4A to 4D, respectively.

Figure 4A:
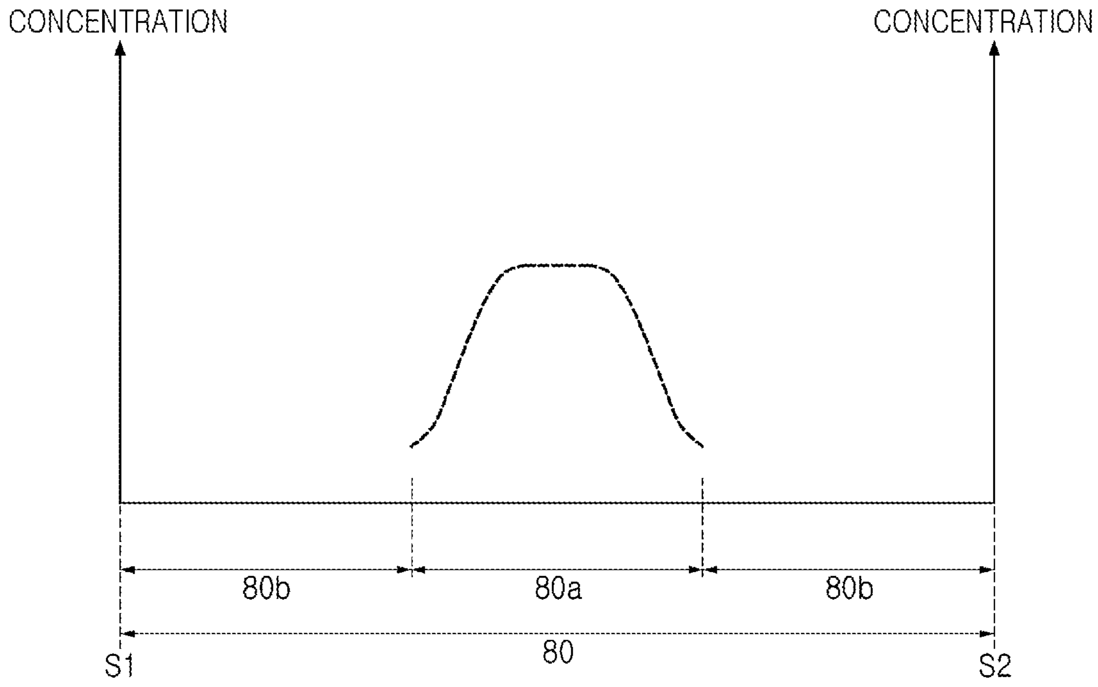
FIG. 4A is a graph illustrating an example of a change in concentration of a second element in a semiconductor device according to an example embodiment.

In an example, referring to FIG. 4A, in the first material region 80*a*, the second element, for example, a Nb element, may have a concentration increasing in a horizontal direction, away from the first side surface S1 and the second side surface S2. That is, in the first material region 80*a* of the first electrode 80, the concentration of the second element may increase in a direction, away from a side surface of the first electrode 80.

In the first material region 80*a*, the concentration of the second element may be highest in a central region between the first side surface S1 and the second side surface S2. In the first material region 80*a*, the concentration of the second element may gradually increase in a direction, away from the first side surface S1 and the second side surface S2.

Figure 4B:
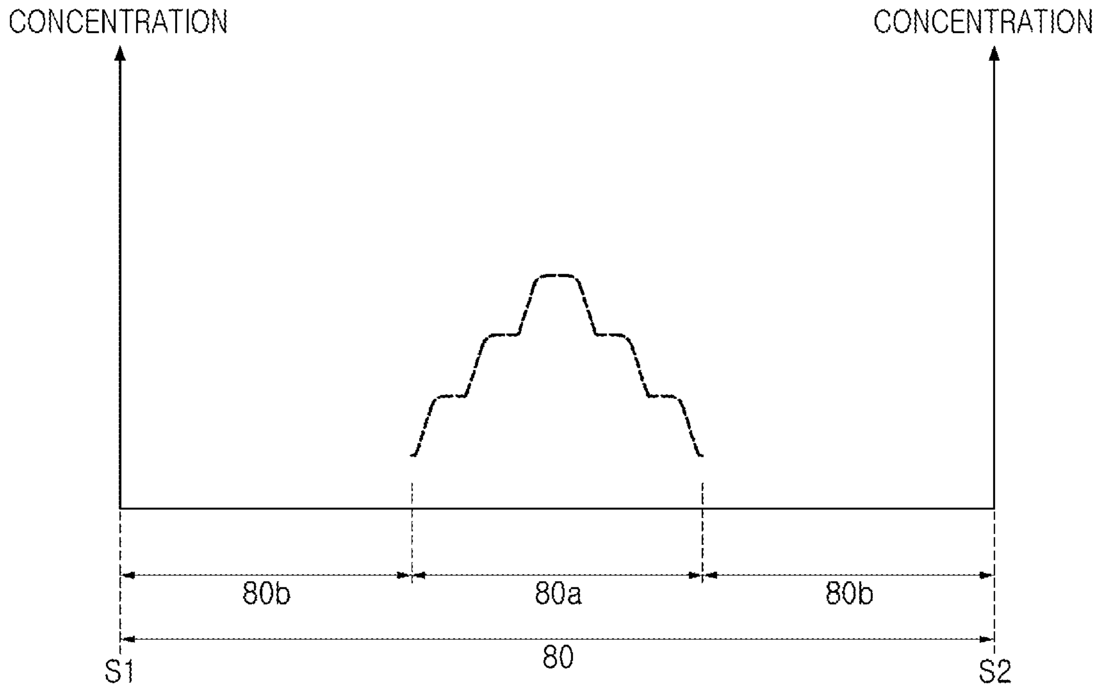
FIG. 4B is a graph illustrating another example of a change in concentration of a second element in a semiconductor device according to an example embodiment.

In another example, referring to FIG. 4B, in the first material region 80*a*, the second element, for example, a Nb element, may have a concentration increasing in a stepwise manner in a direction, away from the first side surface S1 and the second side surface S2. In the first material region 80*a*, the concentration of the second element may be highest in a central region between the first side surface S1 and the second side surface S2.

Figure 4C:
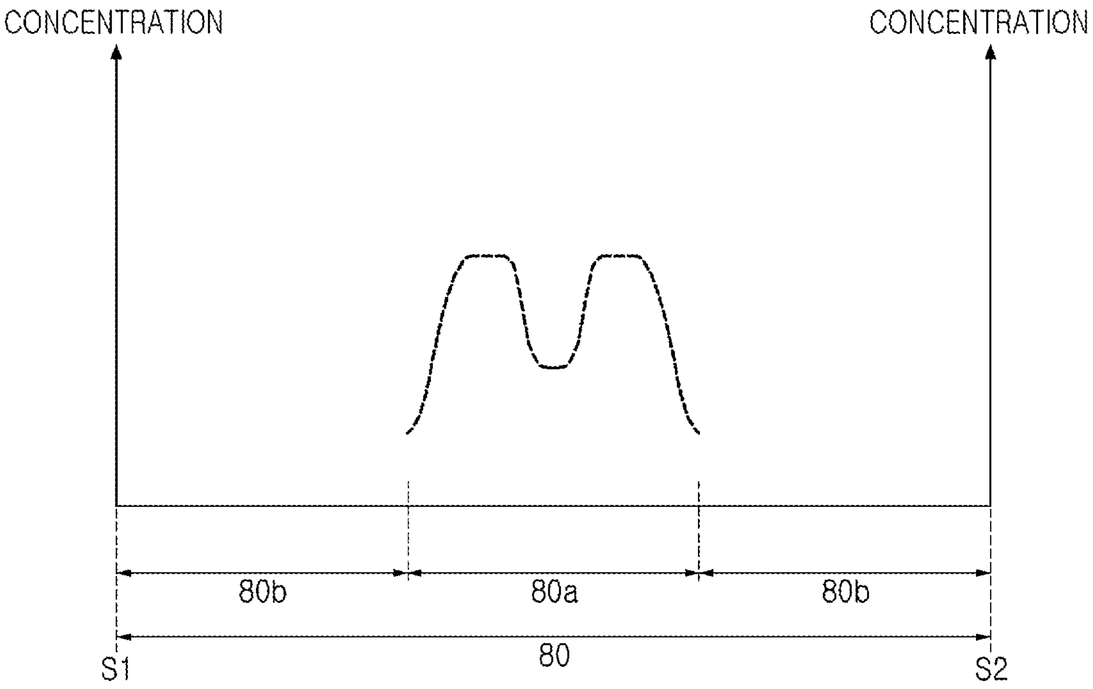
FIG. 4C is a graph illustrating another example of a change in concentration of a second element in a semiconductor device according to an example embodiment.

In another example, referring to FIG. 4C, in the first material region 80*a*, the second element, for example, a Nb element, may have a concentration gradually increasing in a direction, away from the first side surface S1 and the second side surface S2, and may have a decreasing concentration in a central region between the first side surface S1 and the second side surface S2.

Figure 4D:
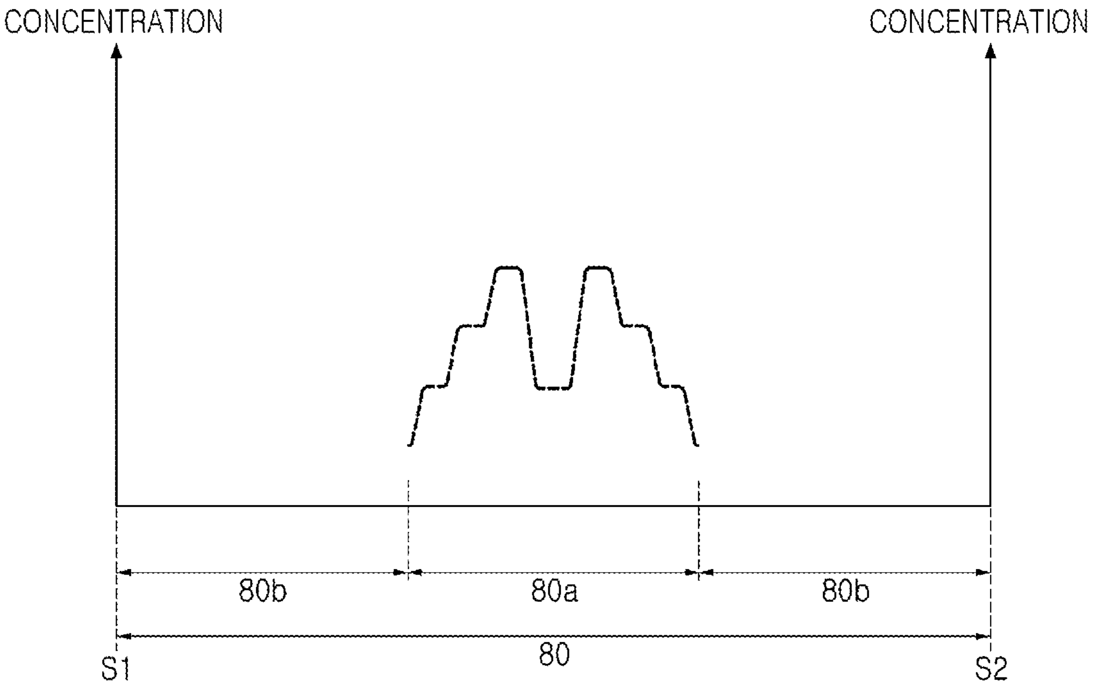
FIG. 4D is a graph illustrating another example of a change in concentration of a second element in a semiconductor device according to an example embodiment.

In another example, referring to FIG. 4D, in the first material region 80*a*, the second element, for example, a Nb element, may have a concentration increasing in a stepwise manner in a direction, away from the first side surface S1 and the second side surface S2, and may have a decreasing concentration in a central region between the first side surface S1 and the second side surface S2.

Hereinafter, various modifications of components of the above-described example embodiment will be described. The various modifications of the components of the above-described example embodiment described below will mainly be described with respect to components to be modified or components to be replaced. In addition, the components that are modifiable or replaceable to be described below are described with reference to drawings below, but the components that are modifiable or replaceable are combined with each other, or are combined with the components described above to configure a semiconductor device according to example embodiments.

Figure 5A:
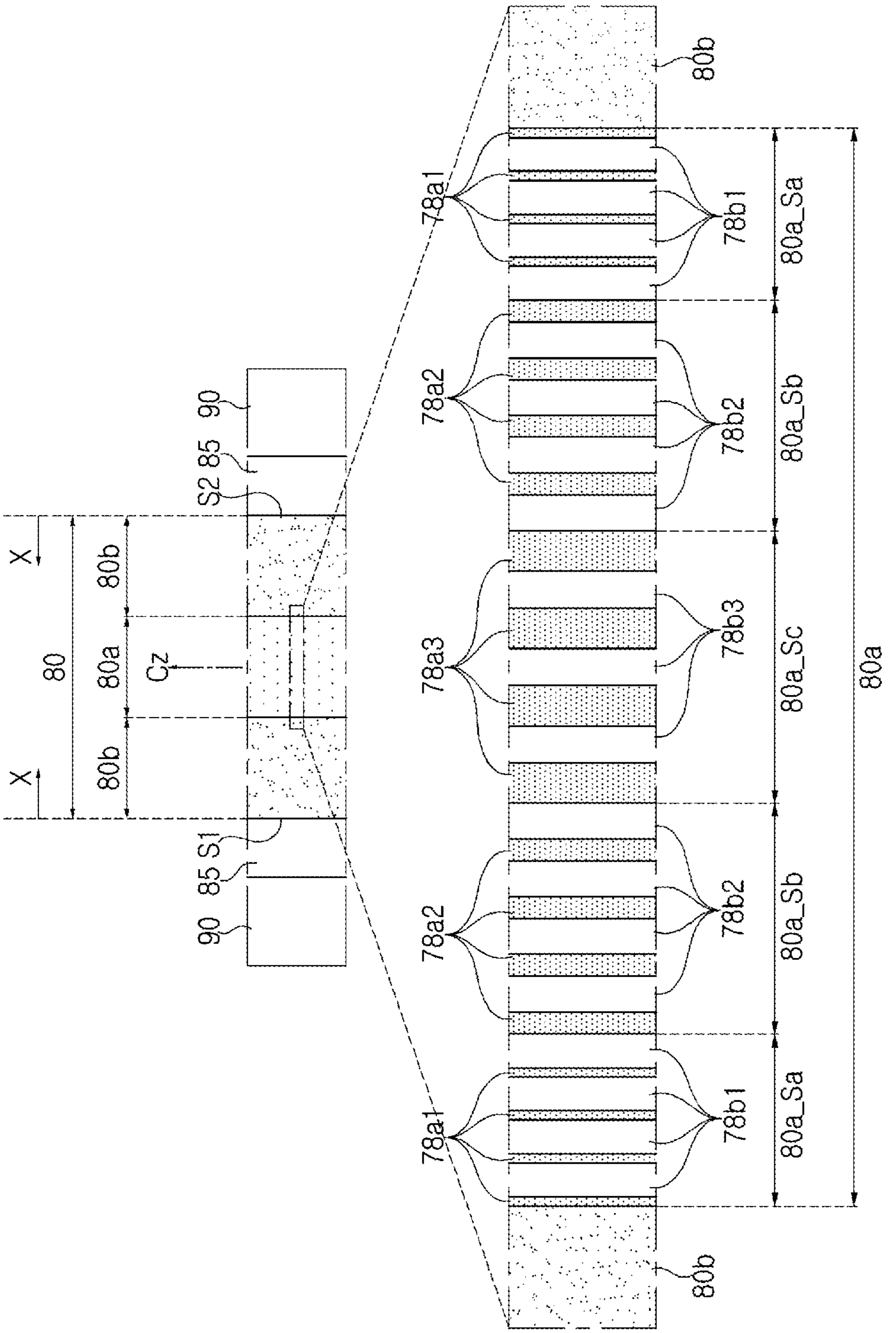
FIG. 5A is a schematic partially enlarged view illustrating an example of a first electrode of a semiconductor device according to an example embodiment.
Figure 5B:
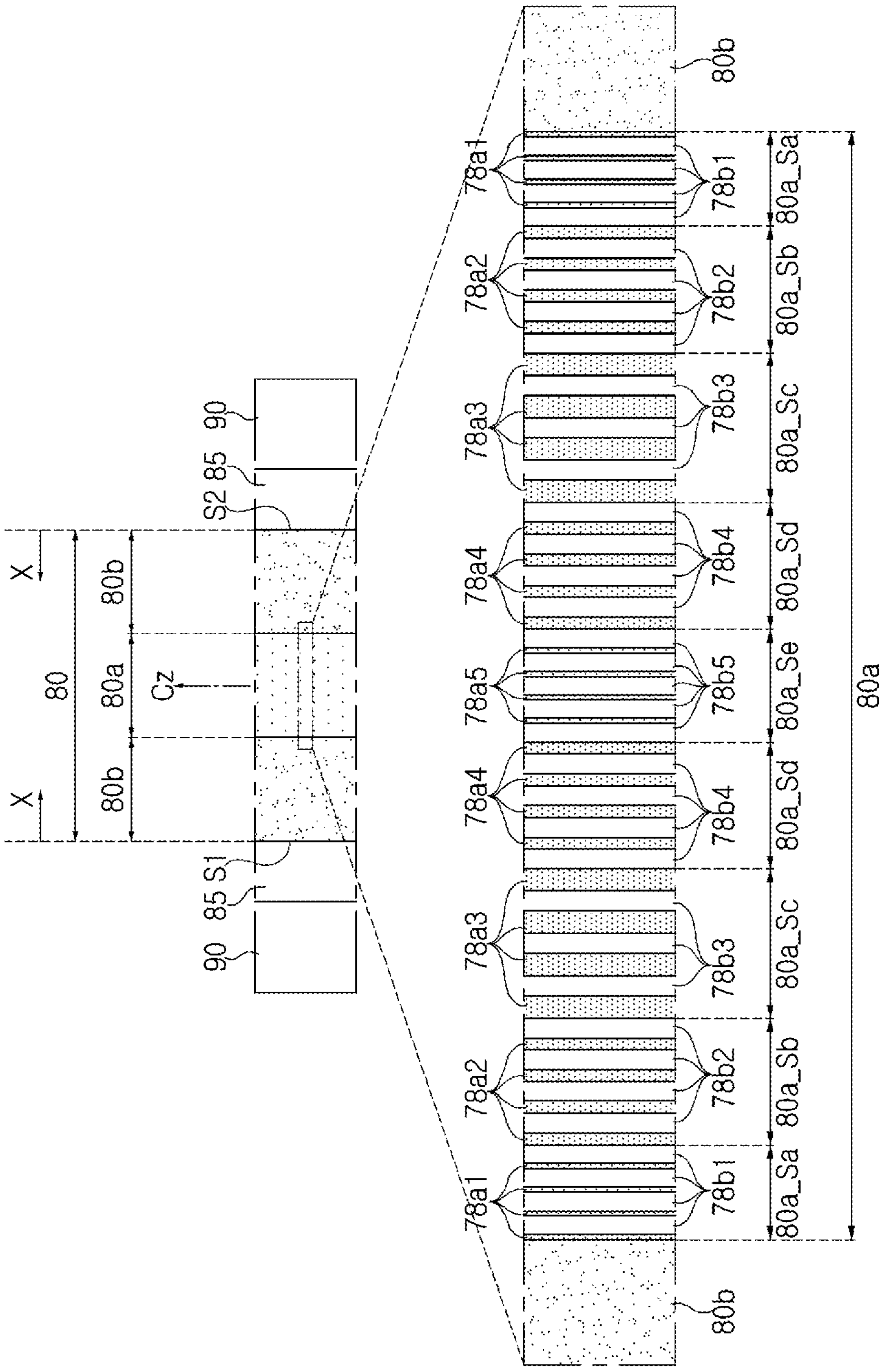
FIG. 5B is a schematic partially enlarged view illustrating a modification of a first electrode of a semiconductor device according to an example embodiment.

FIGS. 5A and 5B are diagrams illustrating various examples of the first material region 80*a* in FIGS. 3A and 3B, and may be partially enlarged views corresponding to the partially enlarged view of FIG. 3B.

In an example, referring to FIG. 5A, the first material region 80*a* of the first electrode 80 may include a first sub-region 80*a*_Sa and a second sub-region 80*a*_Sb that are sequentially disposed in the horizontal direction X, toward the vertical central axis Cz of the first electrode 80 from the side surfaces S1 and S2 of the first electrode 80. The first material region 80*a* may further include a third sub-region 80*a*_Sc. The third sub-region 80*a*_Sc may be disposed at a position farther than that of the second sub-region and the first sub-region 80*a*_Sa from the side surfaces S1 and S2 of the first electrode 80. The third sub-region 80*a*_Sc may be disposed in a central region of the first electrode 80. The second sub-region 80*a*_Sb may be disposed between the first sub-region 80*a*_Sa and the third sub-region 80*a*_Sc.

The first sub-region 80_a__Sa may include first layers 78_a_1 and second layers 78_b_1 alternately stacked in the horizontal direction X. The second sub-region 80_a__Sb may include third layers 78_a_2 and fourth layers 78_b_2 alternately stacked in the horizontal direction X. The third sub-region 80_a__Sc may include fifth layers 78_a_3 and sixth layers 78_b_3 alternately stacked in the horizontal direction X.

The first layers 78_a_1 may be first NbN layers. The second layers 78_b_1 may be first TiN layers. The third layers 78_a_2 may be second NbN layers. The fourth layers 78_b_2 may be second TiN layers. The fifth layers 78_a_3 may be third NbN layers. The sixth layers 78_b_3 may be third TiN layers. Hereinafter, for easier understanding, example embodiments will be described by directly citing TiN and NbN. Accordingly, the first sub-region 80_a__S a may include the first NbN layers 78_a_1 and the first TiN layers 78_b_1 alternately stacked in the horizontal direction X. The second sub-region 80_a__Sb may include the second NbN layers 78_a_2 and the second TiN layers 78_b_2 alternately stacked in the horizontal direction X. The third sub-region 80_a__Sc may include the third NbN layers 78_a_3 and the third TiN layers 78_b_3 alternately stacked in the horizontal direction X.

The first NbN layers 78_a_1 may have the same thickness. The first TiN layers 78_b_1 may have the same thickness. The second NbN layers 78_a_2 may have the same thickness. The second TiN layers 78_b_2 may have the same thickness. The third NbN layers 78_a_3 may have the same thickness. The third TiN layers 78_b_3 may have the same thickness.

A thickness of each of the first TiN layers 78_b_1 may be greater than a thickness of each of the first NbN layers 78_a_1. A thickness of each of the third TiN layers 78_b_3 may be smaller than a thickness of each of the third NbN layers 78_a_3.

A thickness of each of the second NbN layers 78_a_2 may be greater than the thickness of each of the first NbN layers 78_a_1. The thickness of each of the third NbN layers 78_a_3 may be greater than the thickness of each of the second NbN layers 78_a_2.

In an example embodiment, the first to third TiN layers 78_b_1, 78_b_2, and 78_b_3 may have the same thickness (e.g., the same horizontal thickness). Accordingly, a concentration of a Ti element in the second sub-region 80_a__Sb may be the same as a concentration of a Ti element in the first sub-region 80_a__Sa, and a concentration of a Ti element in the third sub-region 80_a__Sc may be the same as the concentration of the Ti element in the second sub-region 80_a__Sb. However, example embodiments are not limited thereto. For example, a concentration of the Ti element may decrease in a horizontal direction, away from side surfaces S1 and S2 of the first electrode 80. The first NbN layers 78_a_1 may have a first thickness. The second NbN layers 78_a_2 may have a second thickness greater than the first thickness. The third NbN layers 78_a_3 may have a third thickness greater than the second thickness. Accordingly, a content ratio of a Nb element in the second sub-region 80_a__Sb may be higher than a content ratio of a Nb element in the first sub-region 80_a__Sa, and a content ratio of a Nb element in the third sub-region 80_a__Sc may be higher than the content ratio of the Nb element in the second sub-region 80_a__Sb. A concentration of the Nb element in the second sub-region 80_a__Sb may be higher than a concentration of the Nb element in the first sub-region 80_a__Sa, and a concentration of the Nb element in the third sub-region 80_a__Sc may be higher than the concentration of the Nb element in the second sub-region 80_a__Sb. Accordingly, a content ratio of the Ti element to the Nb element may decrease in a horizontal direction, away from side surfaces S1 and S2 of the first electrode 80.

In another example, referring to FIG. 5B, the first material region 80_a_ of the first electrode 80 may include a first sub-region 80_a__Sa, a second sub-region 80_a__Sb, a third sub-region 80_a__Sc, a fourth sub-region 80_a__Sd, and a fifth sub-region 80_a__Se that are sequentially stacked in a direction (e.g., the horizontal direction X), toward the vertical central axis Cz of the first electrode 80 from the side surfaces S1 and S2 of the first electrode 80. The fifth sub-region 80_a__Se may be disposed in a central region of the first electrode 80.

The first to third sub-regions 80_a__Sa, 80_a__Sb, and 80_a__Sc may be substantially the same as the first to third sub-regions 80_a__Sa, 80_a__Sb, and 80_a__Sc described with reference to FIG. 5A.

The fourth sub-region 80_a__Sd may include fourth TiN layers 78_b_4 and fourth NbN layers 78_a_4 alternately stacked in the horizontal direction X. The fifth sub-region may include fifth TiN layers 78_b_5 and fifth NbN layers 78_a_5 alternately stacked in the horizontal direction X. The fourth TiN layers 78_b_4 may have the same thickness. The fourth NbN layers 78_a_4 may have the same thickness. The fifth TiN layers 78_b_5 may have the same thickness. The fifth NbN layers 78_a_5 may have the same thickness.

A thickness of each of the fourth NbN layers 78_a_4 may be smaller than a thickness of each of the third NbN layers 78_a_3. A thickness of each of the fifth NbN layers 78_a_5 may be smaller than a thickness of each of the fourth NbN layers 78_a_4. Accordingly, a content ratio of a Nb element in the second sub-region 80_a__Sb may be higher than a content ratio of a Nb element in the first sub-region 80_a__Sa. A content ratio of a Nb element in the third sub-region 80_a__Sc may be higher than the content ratio of the Nb element in the second sub-region 80_a__Sb. A content ratio of a Nb element in the fourth sub-region 80_a__Sd may be lower than the content ratio of the Nb element in the third sub-region 80_a__Sc. A content ratio of a Nb element in the fifth sub region may be lower than the content ratio of the Nb element in the fourth sub-region A concentration of the Nb element in the second sub-region 80_a__Sb may be higher than a concentration of the Nb element in the first sub-region 80_a__Sa. A concentration of the Nb element in the third sub-region 80_a__Sc may be higher than a concentration of the Nb element in the second sub-region 80_a__Sb. A concentration of the Nb element in the fourth sub-region 80_a__Sd may be lower than the concentration of the Nb element in the third sub-region 80_a__Sc. A concentration of the Nb element in the fifth sub-region 80_a__Se may be lower than the concentration of the Nb element in the fourth sub-region 80_a__Sd.

Figure 6A:
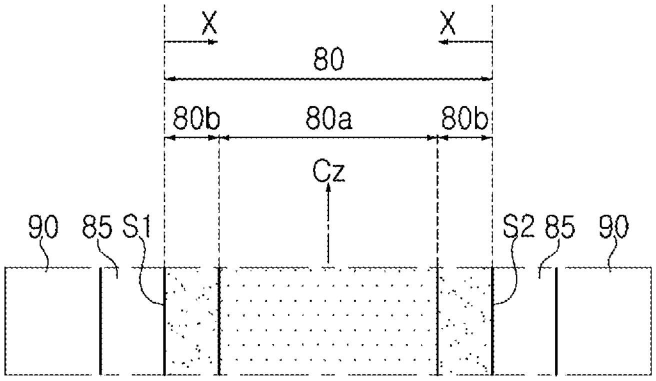
FIG. 6A is a schematic partially enlarged view illustrating a modification of a first electrode of a semiconductor device according to an example embodiment.
Figure 6B:
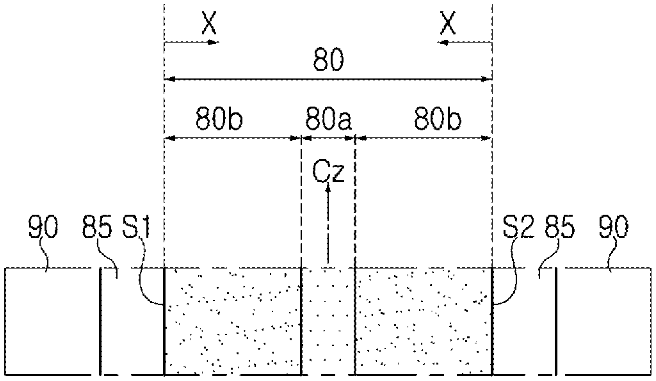
FIG. 6B is a schematic partially enlarged view illustrating a modification of a first electrode of a semiconductor device according to an example embodiment.

In the example embodiments described above with reference to FIGS. 3A to 5B, a width of the first material region 80_a_ may be same as a width of the second material region 80_b_ positioned on either side of the first material region 80_a_. However, embodiments are not limited thereto. For example, the width of the first material region may be different from the width of the second material region 80_b_ positioned on either side of the first material region 80_a_. Examples in which the width of the first material region 80_a_ is different from the width of the second material region 80_b_ will be described with reference to FIGS. 6A and 6B. FIGS. 6A and 6B are conceptual diagrams illustrating the widths of the first material region 80_a_ and the second material region 80_b_ in the example embodiments described above with reference to FIGS. 3A to 5B, and may be partially enlarged views corresponding to the partially enlarged view of FIG. 3B.

In an example, referring to FIG. 6A, the width of the first material region 80*a* may be greater than the width of the second material region 80*b* positioned on either side of the first material region 80*a*. For example, the width of the first material region 80*a* may be greater than the width of the second material region 80*b* positioned on each respective side of the first material region 80*a*.

In another example, referring to FIG. 6B, the width of the first material region may be smaller than the width of the second material region 80*b* positioned on either side of the first material region 80*a*. For example, the width of the first material region may be smaller than the width of the second material region 80*b* positioned on each respective side of the first material region 80*a*.

In the example embodiments described above with reference to FIGS. 1 to 6B, the first electrode 80 may include the first material region 80*a* and the second material region 80*b*. However, example embodiments are not limited thereto. For example, in the first electrode 80, the second material region 80*b* may be omitted. Various examples in which the second material region 80*b* is omitted in the first electrode 80 as described above and the first electrode 80 includes the first material region 80*a* will be described with reference to FIGS. 7A and 7B, respectively.

Figure 7A:
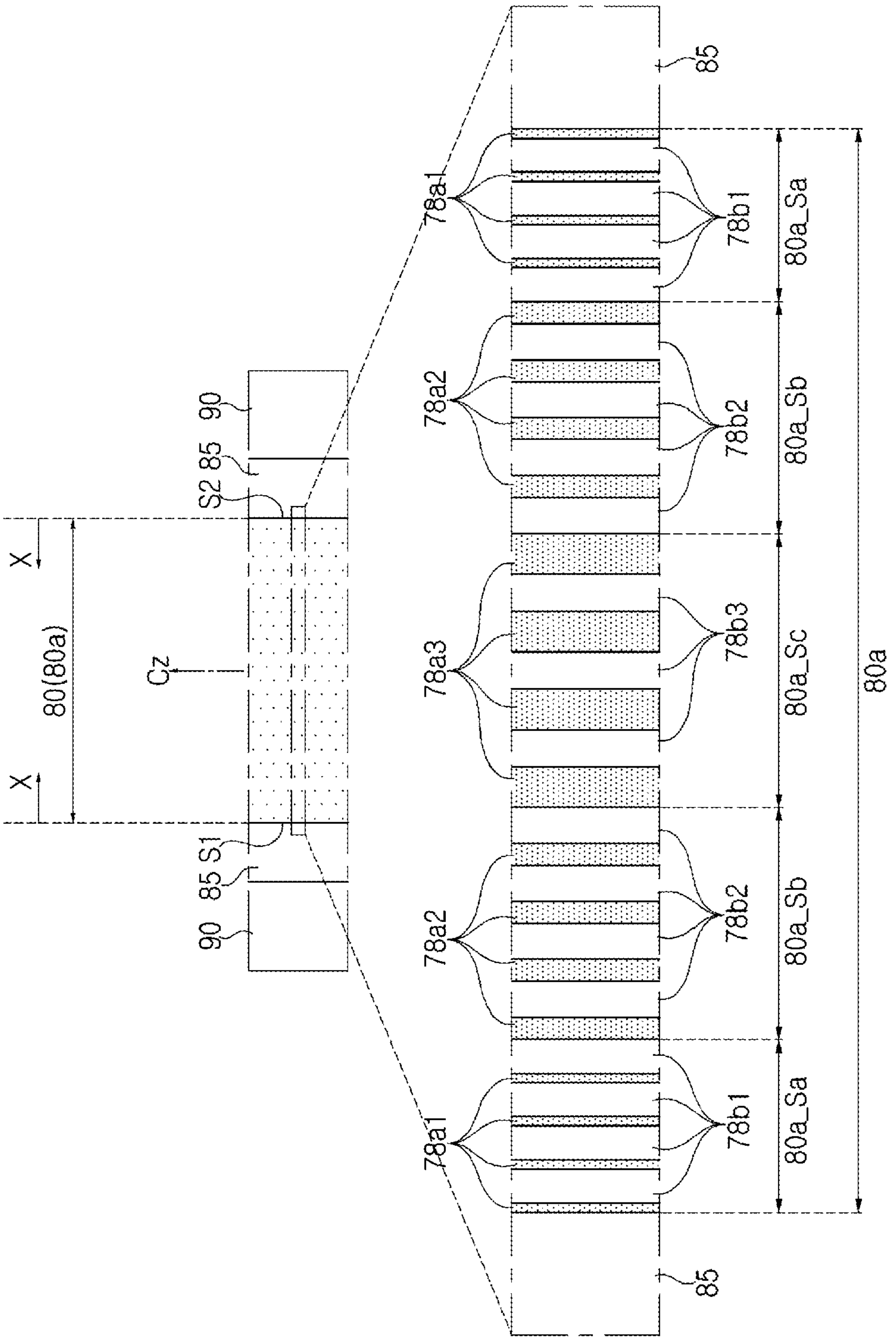
FIG. 7A is a schematic partially enlarged view illustrating a modification of a first electrode of a semiconductor device according to an example embodiment.

Referring to FIG. 7A, the first electrode 80 may include the first material region as described with reference to FIG. 5A or the first material region 80*a* as described with reference to FIG. 5B. For example, the first material region 80*a* may include the first sub-region 80*a*_Sa, the second sub-region 80*a*_Sb, and the third sub-region 80*a*_Sc sequentially disposed in the horizontal direction X as described with reference to FIG. Referring to FIG. 5A, the first sub-region 80*a*_Sa may include the first NbN layers 78*a*1 and the first TiN layers 78*b*1 alternately stacked in the horizontal direction X.

Figure 7B:
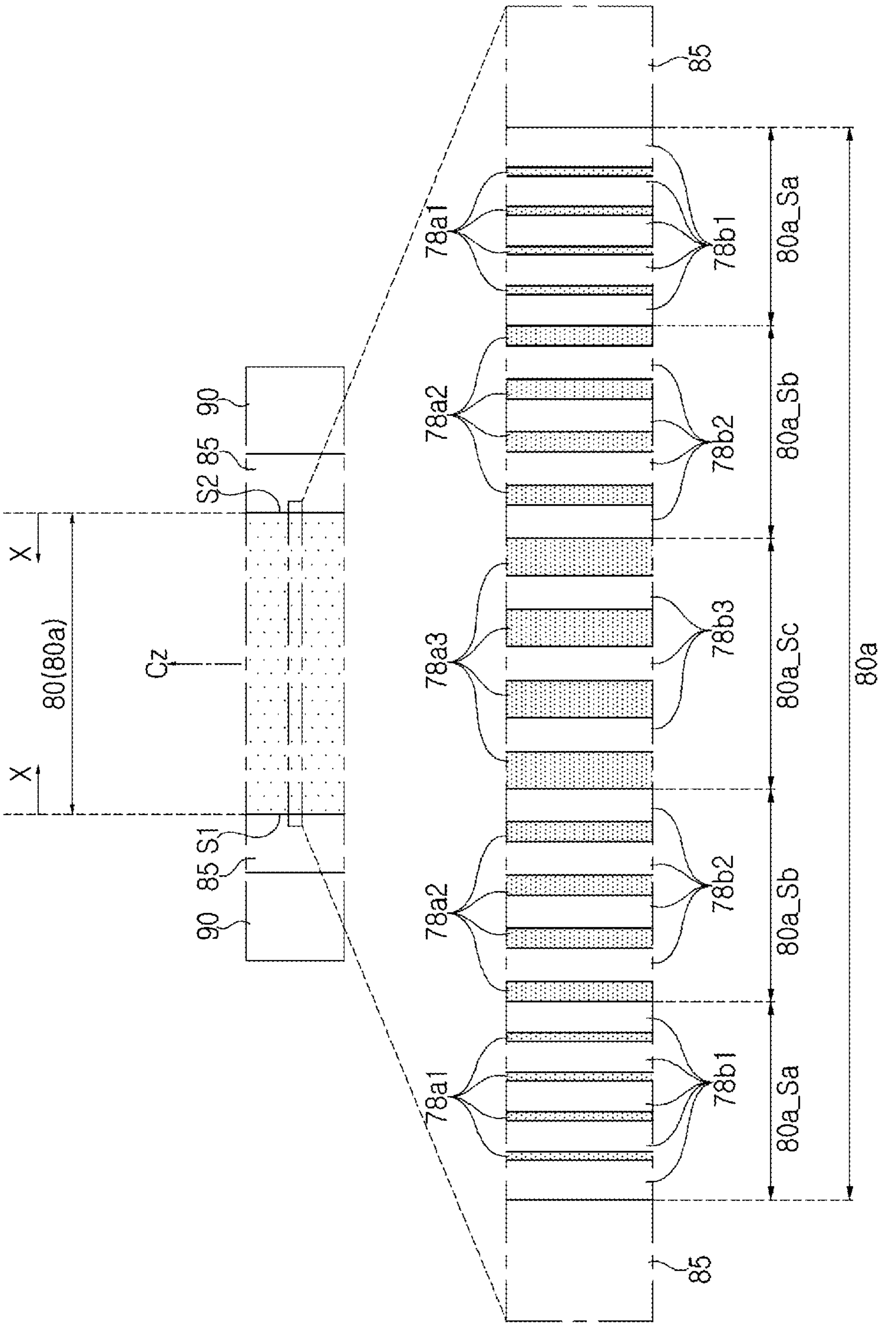
FIG. 7B is a schematic partially enlarged view illustrating a modification of a first electrode of a semiconductor device according to an example embodiment.

Among the first NbN layers 78*a*1 and the first TiN layers 78*b*1 in the first sub-region 80*a*_Sa, one of the first NbN layers 78*a*1 may be in contact with the dielectric layer 85. However, example embodiments are not limited thereto. For example, as illustrated in FIG. 7B, among the first NbN layers 78*a*1 and the first TiN layers 78*b*1 in the first sub-region 80*a*_Sa, one of the first TiN layers 78*b*1 may be in contact with the dielectric layer 85.

Figure 8A:
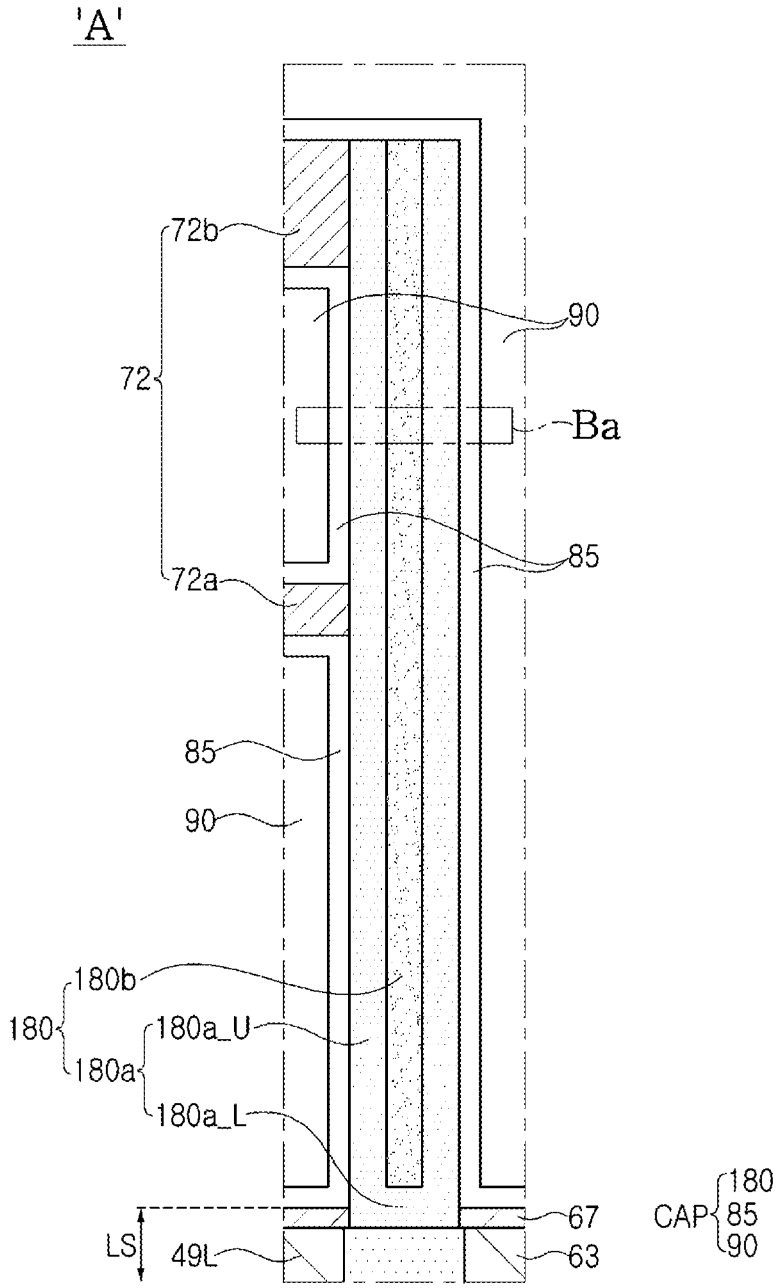
FIGS. 8A and 8B are schematic partially enlarged views illustrating a modification of a first electrode of a semiconductor device according to an example embodiment.

A modification of the first electrode 80 including the first material region 80*a* and the second material region 80*b* described in the example embodiments with reference to FIGS. 1 to 6B will be described with reference to FIGS. 8A and 8B. FIG. 8A is a partially enlarged view illustrating a modification of a region indicated by “A” of FIG. 2, and FIG. 8B is a partially enlarged view of a region indicated by “Ba” of FIG. 8A.

Figure 8B:
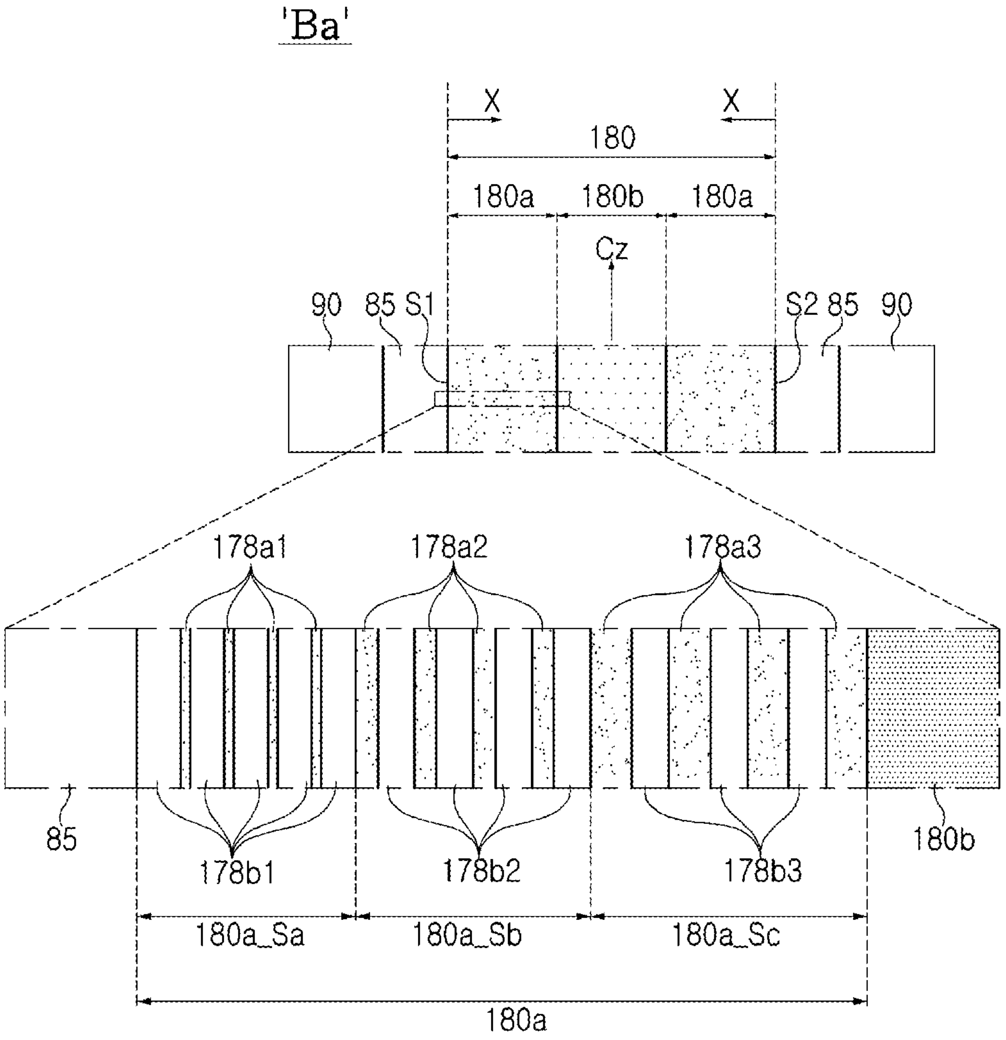

Referring to FIGS. 8A and 8B, the first electrode 80 described with reference to FIGS. 3A and 3B may be modified into a first electrode 180 including a first material region 180*a* and a second material region 180*b* as described with reference to FIGS. 8A and 8B.

In the first electrode 180, the first material region 180*a* may include a lower portion 180*a*_L below the second material region 180*b*, and an upper portion 180*a*_U extending upward from an edge region of the lower portion 180*a*_L and covering a side surface of the second material region 180*b*. The first electrode 180 may include a first element, a second element, and a third element. The first element may be a titanium (Ti) element, the second element may be a niobium (Nb) element, and the third element may be a nitrogen (N) element.

The second material region 180*b* may be formed of a material the same as that of the second material region described above (80*b* in FIGS. 3A and 3B). For example, the second material region 180*b* may include a material including the first element and the third element, for example, TiN.

The first material region 180*a* may include the first element, the second element, and the third element. The first material region 180*a* may include a material having a concentration of the second element that varies according to a distance from a side surface of the first electrode 180. For example, in the first material region 180*a*, the concentration of the second element may increase as the distance from the side surface of the first electrode 180 increases.

The first material region 180*a* of the first electrode 180 may include a first sub-region 180*a*_Sa, a second sub-region 180*a*_Sb, and a third sub-region 180*a*_Sc that are sequentially disposed in a horizontal direction (e.g., the horizontal direction X) toward a vertical central axis Cz of the first electrode 180 from side surfaces S1 and S2 of the first electrode 180.

The first sub-region 180*a*_Sa may include first NbN layers 178*a*1 and first TiN layers 178*b*1 alternately stacked in the horizontal direction X. The second sub-region 180*a*_Sb may include second NbN layers 178*a*2 and second TiN layers 178*b*2 alternately stacked in the horizontal direction X. The third sub-region 180*a*_Sc may include third NbN layers 178*a*3 and third TiN layers 178*b*3 alternately stacked in the horizontal direction X.

The first NbN layers 178*a*1 may have the same thickness. The first TiN layers 178*b*1 may have the same thickness. The second NbN layers 178*a*2 may have the same thickness. The second TiN layers 178*b*2 may have the same thickness. The third NbN layers 178*a*3 may have the same thickness. The third TiN layers 178*b*3 may have the same thickness.

A thickness of each of the first TiN layers 178*b*1 may be greater than a thickness of each of the first NbN layers 178*a*1. A thickness of each of the third TiN layers 178*b*3 may be smaller than a thickness of each of the third NbN layers 178*a*3. A thickness of each of the second NbN layers 178*a*2 may be greater than a thickness of each of the first NbN layers 178*a*1, and a thickness of each of the third NbN layers 178*a*3 may be greater than a thickness of each of the second NbN layers 178*a*2.

In an example, among the first NbN layers 178*a*1 and the first TiN layers 178*b*1, one of the first TiN layers 178*b*1 may be in contact with the dielectric layer 85.

In another example, among the first NbN layers 178*a*1 and the first TiN layers 178*b*1, one of the first NbN layers 178*a*1 may be in contact with the dielectric layer 85.

Figure 9:
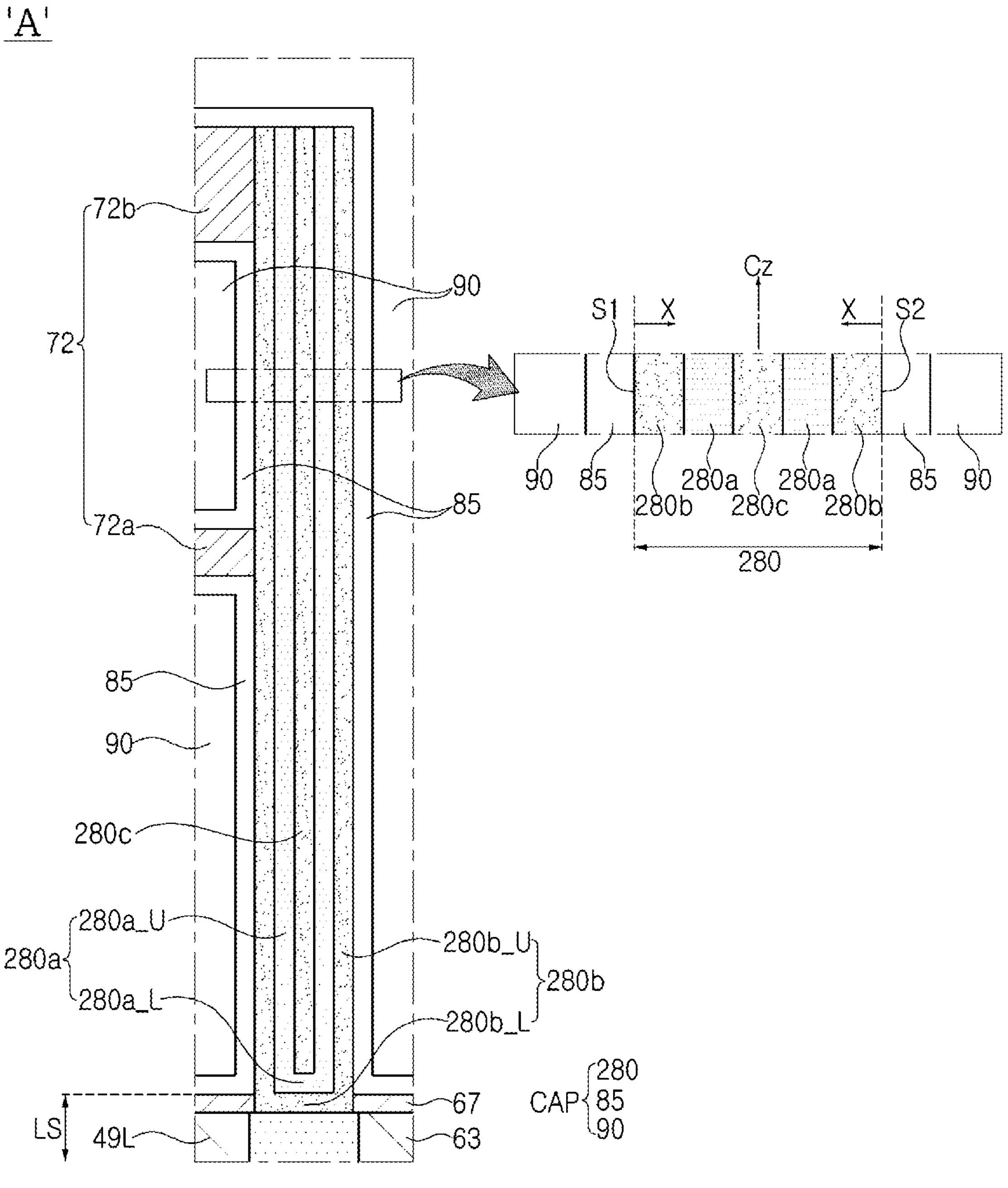
FIG. 9 is a schematic partially enlarged view illustrating a modification of a first electrode of a semiconductor device according to an example embodiment.

A modification of the first electrode 80 including the first material region 80*a* and the second material region 80*b* described in the example embodiments with reference to FIGS. 1 to 6B will be described with reference to FIG. 9. FIG. 9 is a partially enlarged view illustrating a modification of a region indicated by “A” of FIG. 2.

Referring to FIG. 9, the first electrode 80 described with reference to FIGS. 3A and 3B may be modified into a first electrode 280 including a first material region 280*a*, a second material region 280*b*, and a third material region 280*c*.

In the first electrode 280, the first material region 280*a* may include a lower portion 280*a*_L below the third material region 280*c*, and an upper portion 280*a*_U extending upward from an edge region of the lower portion 280*a*_L and covering a side surface of the third material region 280c. The second material region 280b may include a lower portion 280b_L below the first material region 280a, and an upper portion 280b_U extending upward from an edge region of the lower portion 280b_L and covering an outer surface of the first material region 280a.

The first electrode 280 may include at least three elements. For example, the first electrode 280 may include a first element, a second element, and a third element. The first element may be a titanium (Ti) element, the second element may be a niobium (Nb) element, and the third element may be a nitrogen (N) element.

The second material region 280b may be formed of a material the same as that of the second material region 80b described above (80b in FIGS. 3A and 3B). For example, the second material region 280b may include a material including the first element and the third element, for example, TiN.

The third material region 280c may be formed of a material the same as that of the second material region 80b described above (80b in FIGS. 3A and 3B). For example, the third material region 280c may include a material including the first element and the third element, for example, TiN. The second material region 280b and the third material region 280c may include the same material.

The first material region 280a may be substantially the same as one of the first material regions 80a described with reference to FIGS. 1 to 6B. For example, the first material region 280a may include at least three elements. For example, the first material region 280a may include the first element, the second element, and the third element, and a concentration of the second element in the first material region 280a may increase as a distance from a side surface of the first electrode 280 increases.

Figure 10:
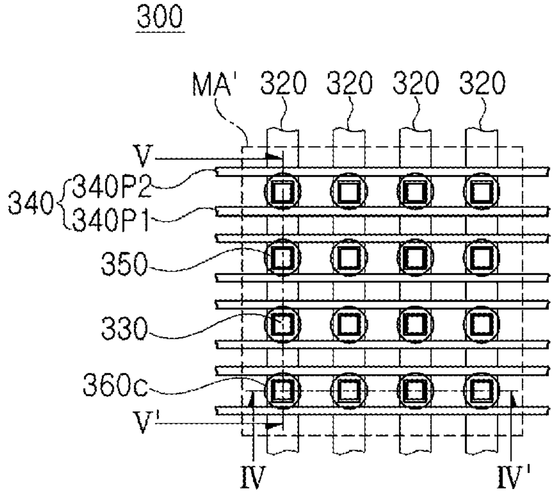
FIGS. 10 and 11 are schematic diagrams illustrating a modification of a semiconductor device according to an example embodiment.
Figure 11:
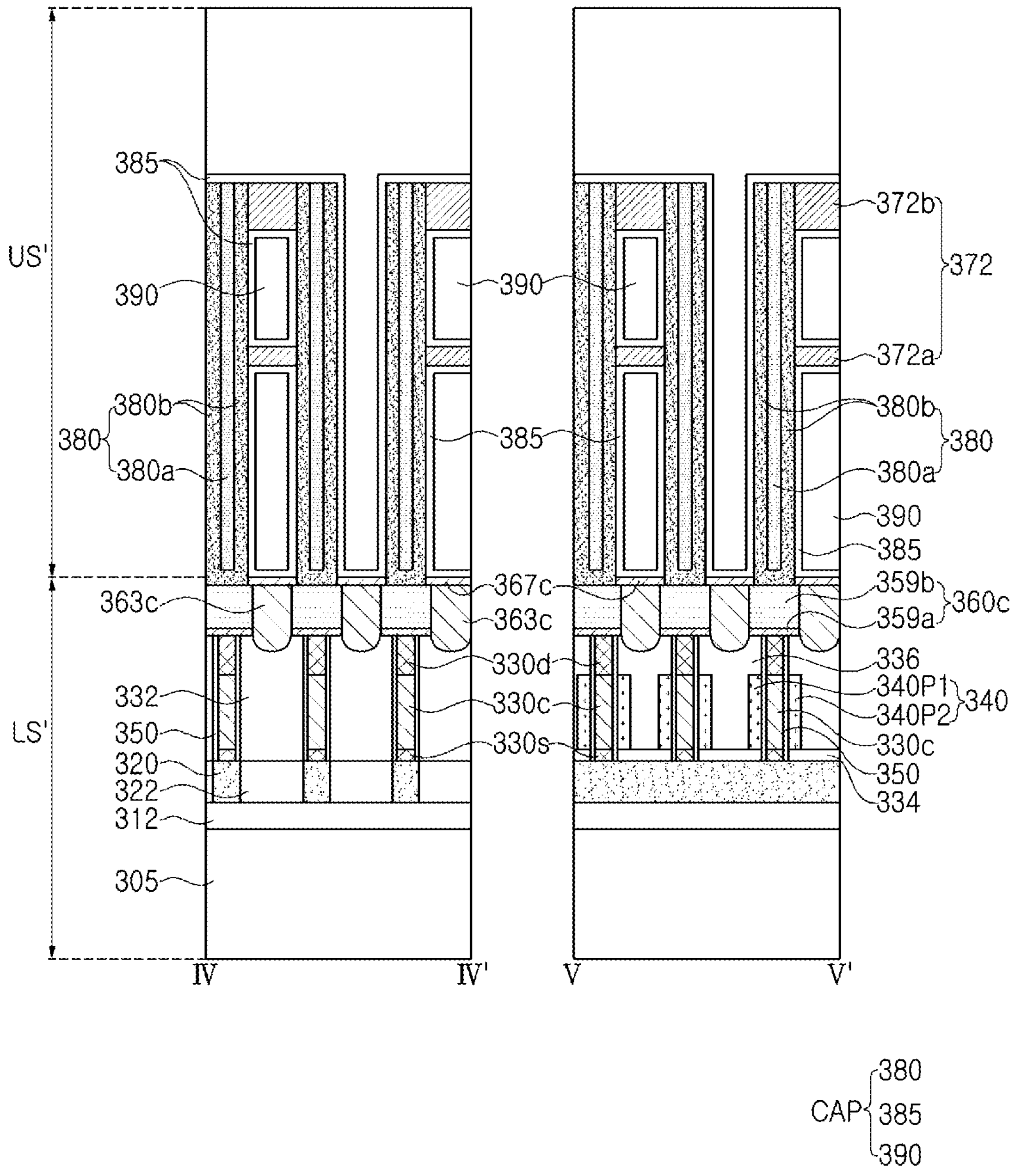

Next, a modification of the lower structure LS described with reference to FIGS. 1 and 2 will be described with reference to FIGS. 10 and 11. In FIGS. 10 and 11, FIG. 10 is a schematic plan view illustrating a semiconductor device 300 in a modification, and FIG. 11 is a cross-sectional view illustrating a region taken along lines IV-IV' and V-V' of FIG. 10.

Referring to FIGS. 10 and 11, a semiconductor device 300 according to an example embodiment may include a lower structure LS' obtained by modifying the lower structure LS described with reference to FIGS. 1 and 2.

The lower structure LS' may include a substrate 305, a plurality of first conductive lines 320 disposed on the substrate 305, channel regions 330c, lower source/drain regions 330s, upper source/drain regions 330d, cell gate electrodes 340, and cell gate dielectrics 350. The substrate 305 may be a semiconductor substrate.

The channel regions 330c, the lower source/drain regions 330s, the upper source/drain regions 330d, and the cell gate electrodes 340 may be included in vertical channel transistors. Here, the vertical channel transistors may be referred to as cell transistors. The vertical channel transistor may refer to a structure in which a channel length of each of the channel regions 330c extends from the substrate 305 in a vertical direction.

The lower structure LS' may further include a lower insulating layer 312 disposed on the substrate 305. On the lower insulating layer 312, the plurality of first conductive lines 320 may be spaced apart from each other in a second horizontal direction, and may extend in a first horizontal direction.

The lower structure LS' may further include a plurality of first lower insulating patterns 322 filling a space between the plurality of first conductive lines 320 on the lower insulating layer 312. The plurality of first lower insulating patterns 322 may extend in a first horizontal direction. Upper surfaces of the plurality of first lower insulating patterns 322 may be disposed on a level the same as those of upper surfaces of the plurality of first conductive lines 320. The plurality of first conductive lines 320 may function as bit lines of the semiconductor device 300.

In an example, the plurality of first conductive lines 320 may include doped polysilicon, a metal, a conductive metal nitride, a conductive metal silicide, a conductive metal oxide, or a combination thereof. For example, the plurality of first conductive lines 320 may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but are not limited thereto. The plurality of first conductive lines 320 may include a single layer or multiple layers including the above-described materials. In an example, the plurality of first conductive lines 320 may include a two-dimensional semiconductor material. For example, the two-dimensional semiconductor material may include graphene, carbon nanotubes, or a combination thereof.

The channel regions 330c may be arranged in a matrix form in which the channel regions 330c are spaced apart from each other in a second horizontal direction and a first horizontal direction on the plurality of first conductive lines 320.

The lower source/drain regions 330s, the channel regions 330c, and the upper source/drain regions 330d may be sequentially stacked (e.g., in a vertical direction).

In an example, one channel region 330c and the lower and upper source/drain regions 330s and 330d disposed below/on the one channel region 330c may have a first width in a horizontal direction and a first height in a vertical direction, and the first height may be greater than the first width. For example, the first height may be about 2 to 10 times the first width, but is not limited thereto.

In an example, the channel regions 330c may include an oxide semiconductor. For example, the oxide semiconductor may include $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel regions 330c may include a single layer or multiple layers of the oxide semiconductor. In some examples, the channel regions 330c may have a bandgap energy greater than that of silicon. For example, the channel regions 330c may have a bandgap energy of about 1.5 eV to about 5.6 eV. For example, the channel regions 330c may have optimal channel performance when the channel regions 330c have a bandgap energy of about 2.0 eV to 4.0 eV. For example, the channel regions 330c may be polycrystalline or amorphous, but are not limited thereto.

In an example, the channel regions 330c may include a two-dimensional semiconductor material. For example, the two-dimensional semiconductor material may include graphene, carbon nanotubes, or a combination thereof.

In an example, the channel regions 330c may include a semiconductor material such as silicon.

Hereinafter, one channel region 330c and one cell gate electrode 340 will mainly be described, but the channel region 330c and the cell gate electrode 340 may be understood as being provided in plurality.

The cell gate electrode 340 may extend in a second horizontal direction X on opposite sidewalls of the channel region 330c. The cell gate electrode 340 may include a first sub-gate electrode 340P1 opposing a first sidewall of the channel region 330*c*, and a second sub-gate electrode 340P2 opposing a second sidewall opposite to the first sidewall of the channel region 330*c*. As one channel region 330*c* is disposed between the first sub-gate electrode 340P1 and the second sub-gate electrode 340P2, the semiconductor device 300 may have a dual-gate transistor structure. However, example embodiments are not limited thereto. The second sub-gate electrode 340P2 may be omitted, and only the first sub-gate electrode 340P1 opposing the first sidewall of the channel region 330*c* may be formed to implement a single-gate transistor structure.

The cell gate electrode 340 may include doped polysilicon, a metal, a conductive metal nitride, a conductive metal silicide, a conductive metal oxide, or a combination thereof. For example, the cell gate electrode 340 may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, but is not limited thereto.

The cell gate dielectric 350 may surround a sidewall of the channel region 330*c*, and may be interposed between the channel region 330*c* and the cell gate electrode 340. For example, the entire sidewall of the channel region 330*c* may be surrounded by the cell gate dielectric 350, and a portion of the sidewall of the cell gate electrode 340 may be in contact with the cell gate dielectric 350. In other example embodiments, the cell gate dielectric 350 may extend in an extension direction of the cell gate electrode 340, that is, a second horizontal direction X, and only two sidewalls opposing the cell gate electrode 340 among sidewalls of the channel region 330*c* may be in contact with the cell gate dielectric 350.

In an example, the cell gate dielectric 350 may be formed of a silicon oxide film, a silicon oxynitride film, a high-k film having a dielectric constant higher than that of a silicon oxide film, or a combination thereof. The high-k film may be formed of a metal oxide or a metal oxynitride. For example, the high-k film usable as the cell gate dielectric 350 may be formed of $HfO_2$, HfSiO, HfSiON, HfTaO, HfSiO, HfZrO, $ZrO_2$, $Al_2O_3$, or a combination thereof, but is not limited thereto.

The lower structure LS' may further include a plurality of second lower insulating patterns 332 disposed on the plurality of first lower insulating patterns 322. The second lower insulating patterns 332 may extend in a first horizontal direction, and the channel region 330*c* may be disposed between two adjacent second lower insulating patterns 332 among the plurality of second lower insulating patterns 332.

The lower structure LS' may further include a first buried layer 334 and a second buried layer 336 disposed in a space between two adjacent channel regions 330*c* between the two adjacent second lower insulating patterns 332. The first buried layer 334 may be disposed on a bottom portion of the space between two adjacent channel regions 330*c*, and the second buried layer 336 may be formed to fill a remaining portion of the space between the two adjacent channel regions 330*c* on the first buried layer 334. An upper surface of the second buried layer 336 may be disposed on a level the same as that of an upper surface of the upper source/drain region 330*d*, and the second buried layer 336 may cover an upper surface of the cell gate electrode 340. Alternatively, the plurality of second lower insulating patterns 332 may be formed of a material layer continuous with the plurality of first lower insulating patterns 322, or the second buried layer 336 may be formed of a material layer continuous with the first buried layer 334.

The lower structure LS' may further include contact structures 360*c* electrically connected to the upper source/drain regions 330*d* on the channel regions 330*c*, and insulating isolation patterns 363*c* between the contact structures 360*c*. Each of the contact structures 360*c* may include a barrier layer 359*a* and a metal layer 359*b* on the barrier layer 359*a*. The lower structure LS' may further include an etch-stop layer 367*c* covering the contact structures 360*c* and the insulating isolation patterns 363*c*. For example, the etch-stop layer 367*c* may cover an entirety of each respective upper surface of the insulating isolation patterns 363*c* and at least a portion of each respective upper surface of the contact structures 360*c*.

The semiconductor device 300 according to an example embodiment may further include an upper structure US' on the lower structure LS'.

The upper structure US' may further include a capacitor CAP and at least one supporter layer 372. The capacitor CAP may be a capacitor of a memory cell storing data in a DRAM device. The capacitor CAP may be referred to as a data storage structure. The capacitor CAP may include first electrodes 380, a second electrode 390 on the first electrodes 380, and a dielectric layer 385 between the first electrodes 380 and the second electrode 390. The dielectric layer 385 and the second electrode 390 may be substantially the same as the dielectric layer (85 in FIGS. 2, 3A and 3B) and the second electrode (90 in FIGS. 2, 3A and 3B) described above. The first electrodes 380 may be in contact with and electrically connected to the contact structures 360*c*, may pass through the etch-stop layer 367*c*, and may extend upward. Each of the first electrodes 380 may have a pillar shape, but example embodiments are not limited thereto. For example, each of the first electrodes 380 may have a cylindrical shape.

The first electrodes 380 may be the same as one of the various first electrodes 80, 180, and 280 described with reference to FIGS. 1 to 9.

The at least one supporter layer 372 may include a lower supporter layer 372*a* and an upper supporter layer 372*b* disposed on different levels. The lower supporter layer 372*a* and the upper supporter layer 372*b* may be in contact with upper regions of the first electrodes 380, and may prevent the first electrodes 380 from collapsing. The lower supporter layer 372*a* may be in contact with the first electrodes 380 on a level lower than that of the upper supporter layer 372*b*, and may prevent deformation such as bending of the first electrodes 380. The at least one supporter layer 372 may include an insulating material such as silicon nitride. In the capacitor CAP, the dielectric layer 385 may be disposed along the first electrodes 380 and surfaces of the at least one supporter layer 372 in contact with the first electrodes 380.

Figure 12:
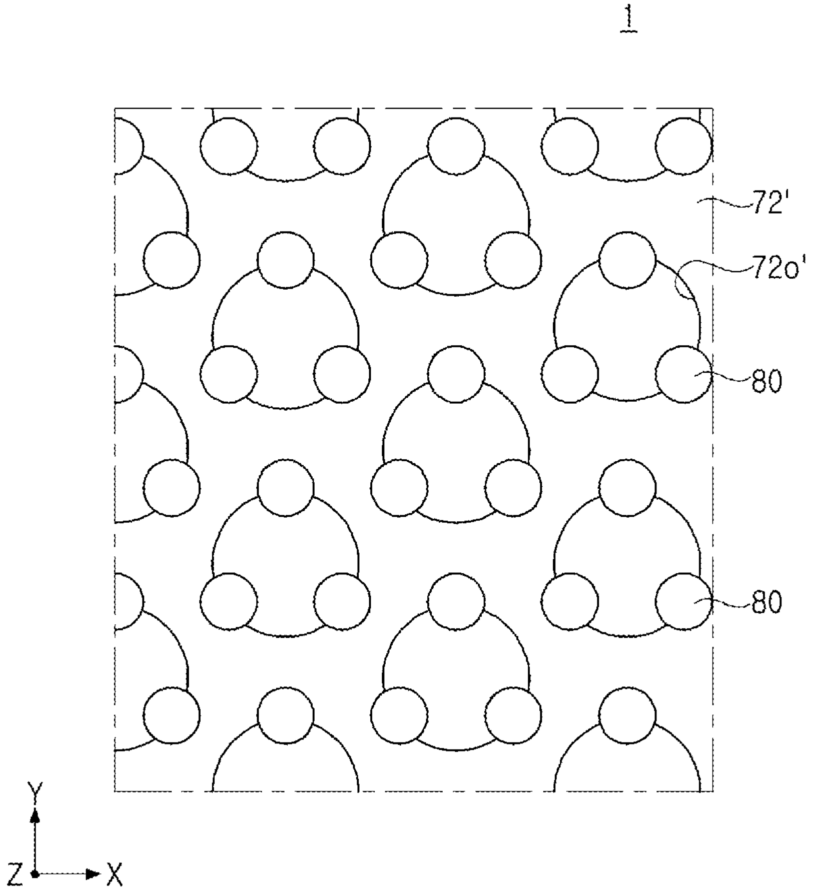
FIG. 12 is a schematic top view illustrating a modification of a semiconductor device according to an example embodiment.

In the top view illustrated in FIG. 1, the opening 72*o* of the at least one supporter layer 72 may have a shape in which the opening 72*o* exposes a portion of a side surface of each of the first electrodes 80 (e.g., four first electrodes), but example embodiments are not limited thereto. FIG. 12 is a schematic top view illustrating a modification of a semiconductor device according to an example embodiment.

In a modification, referring to FIG. 12, the opening 72*o* of the at least one supporter layer 72 illustrated in FIG. 1 may be modified into an opening 72*o*' of at least one supporter layer 72' exposing a portion of a side surface of each of the first electrodes (e.g., three first electrodes), as illustrated in FIG. 12.

Next, an example of a method of forming a semiconductor device according to an example embodiment will be described with reference to FIGS. 13 to 15.

Figure 13:
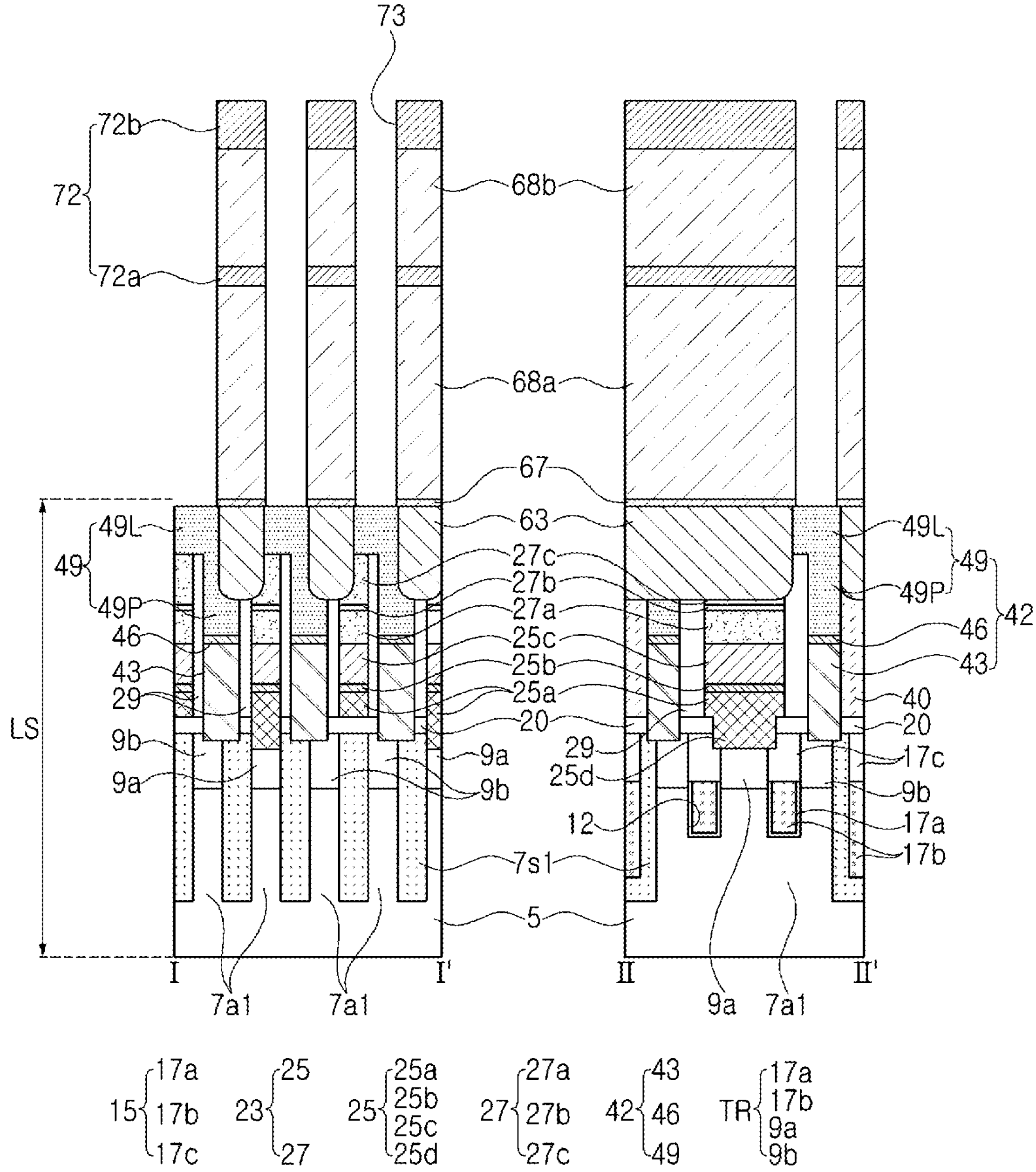
FIGS. 13 to 15 are cross-sectional views illustrating an example of a method of forming a semiconductor device according to an example embodiment.

Referring to FIG. 13, a lower structure LS may be formed. The lower structure LS may be the lower structure LS described with reference to FIGS. 1 and 2, or the lower structure LS' described with reference to FIGS. 10 and 11. For example, the transistors TR, the bit lines 25, and the contact structures 42 may be included, as described with reference to FIGS. 1 and 2.

A lower mold layer 68*a*, a lower supporter layer 72*a*, an upper mold layer 68*b*, and an upper supporter layer 72*b* sequentially stacked on the lower structure LS may be included. The lower mold layer 68*a* and the upper mold layer 68*b* may be formed of the same material, for example, silicon oxide.

An etching process may be performed to form openings 73 exposing the pad portions 49L of the contact structures 42 while passing through the upper supporter layer 72*b*, the upper mold layer 68*b*, the lower supporter layer 72*a*, the lower mold layer 68*a*, and the etch-stop layer 67.

Figure 14:
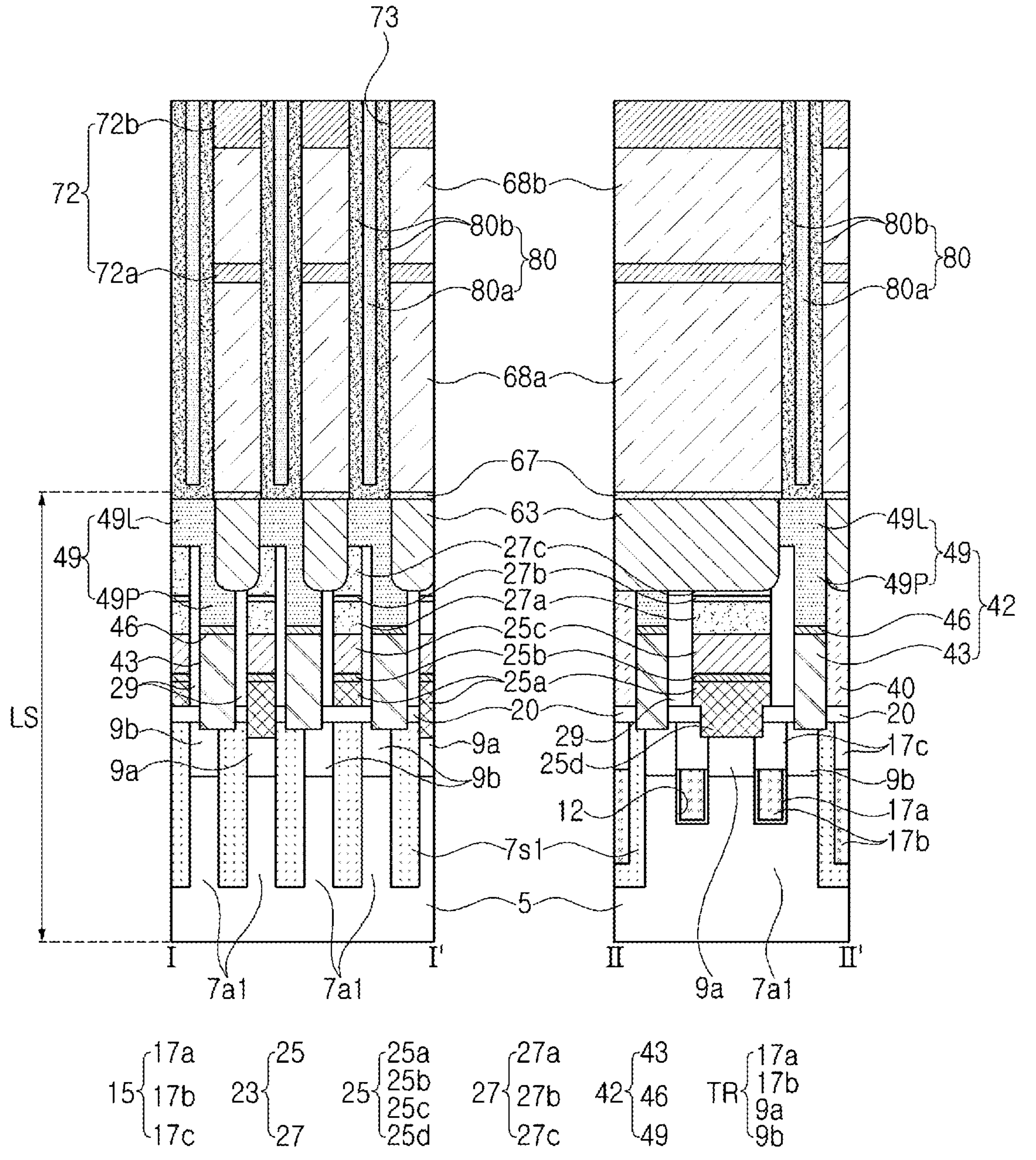

Referring to FIG. 14, first electrodes 80 may be formed in the openings 73. The first electrodes 80 may be formed as one of the first electrodes 80, 180, 280, and 380 described with reference to FIGS. 1 to 11. For example, forming the first electrodes 80 may include forming a material layer of the second material region 80*b* conformally covering the openings 73 described with reference to FIGS. 3A and 3B, forming a material layer of the first material region 80*a* described with reference to FIGS. 3A and 3B on the material layer of the second material region 80*b*, and planarizing the material layer of the first material region 80*a* and the material layer of the second material region 80*b* by performing an etch-back and/or chemical mechanical planarization process.

Figure 15:
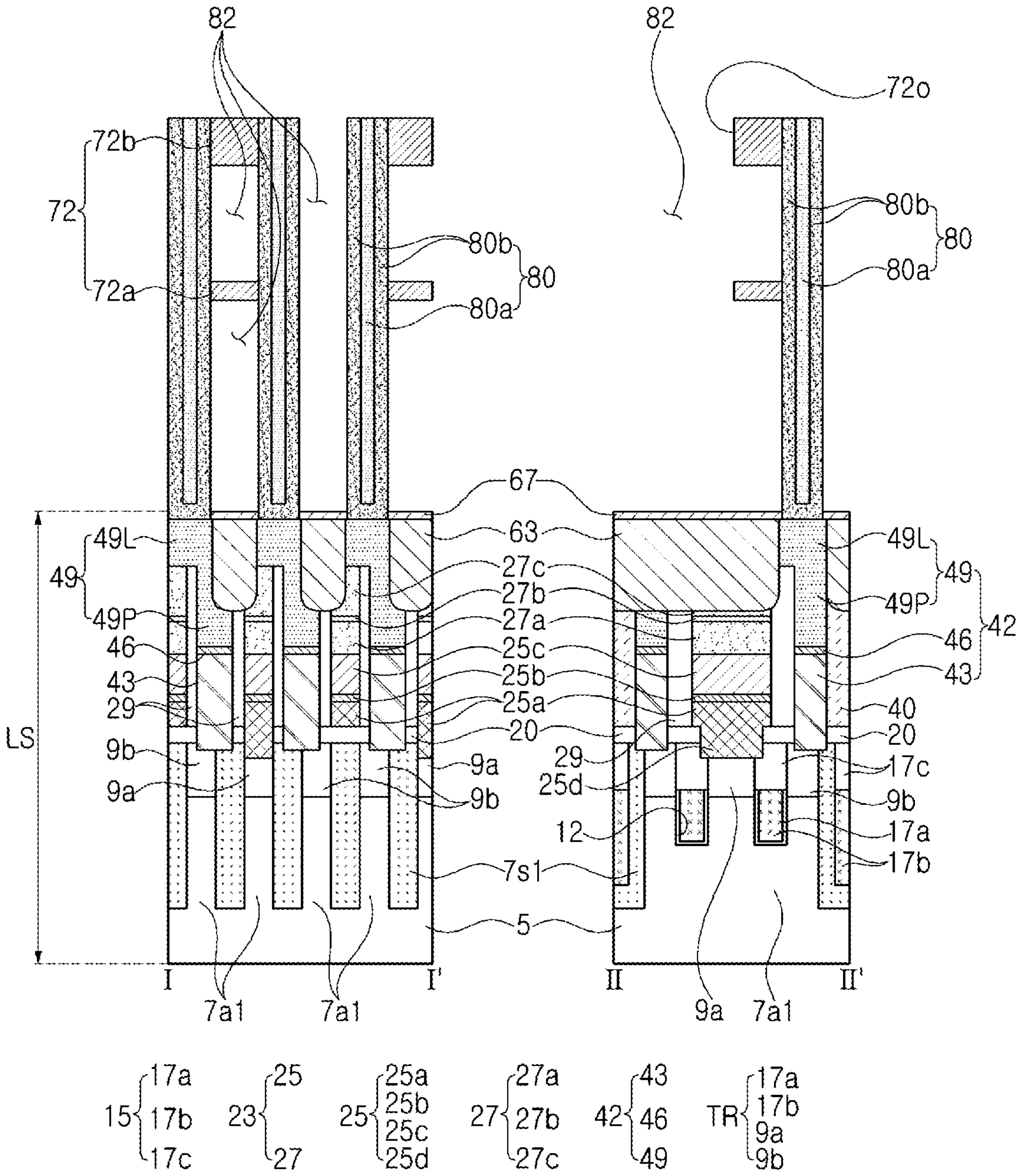

Referring to FIG. 15, openings passing through the upper supporter layer 72*b*, the upper mold layer 68*b*, and the lower supporter layer 72*a* may be formed, and the upper mold layer 68*b* exposed by the openings and the lower mold layer 68*a* may be removed to form an opening 82. Accordingly, the first electrodes 80 supported by the supporter structures 72*a* and 72*b* may be formed on the lower structure LS.

Referring back to FIGS. 1 and 2, a dielectric layer 85, conformally formed along the surfaces of the first electrodes 80 and the supporter structures 72*a* and 72*b* on the lower structure LS, may be formed. Subsequently, a second electrode 90 filling the opening 82 may be formed on the dielectric layer 85.

According to example embodiments, a semiconductor device may include a first electrode, a second electrode, and a dielectric layer between the first electrode and the second electrode. The first electrode, the dielectric layer, and the second electrode may be included in a capacitor capable of storing data in the semiconductor device, such as a DRAM. The first electrode may include a first element, a second element, and nitrogen (N). A degree of stiffness of a first nitride material including the first element may be higher than a degree of stiffness of a second nitride material including the second element. The first electrode may include a region in which a concentration of the first element decreases or remains the same and a concentration of the second element increases in a horizontal direction, away from a side surface of the first electrode. Here, the first nitride material including the first element may be a material having stiffness capable of minimizing deformation of the first electrode, and the second nitride material including the second element may be a material capable of increasing capacitance of the capacitor. Accordingly, it is possible to provide the capacitor including the first electrode capable of increasing capacitance while minimizing deformation, thereby increasing a degree of integration of the semiconductor device.

The various and beneficial advantages and effects of example embodiments are not limited to the above description, and will be more easily understood in the course of describing specific example embodiments.

While example embodiments have been shown and described above, it will be apparent to those skilled in the art that modifications and variations could be made without departing from the scope of example embodiments as defined by the appended claims.

What is claimed is:

1. A semiconductor device comprising:
- a lower structure;
- first electrodes spaced apart from each other on the lower structure;
- a second electrode on the first electrodes; and
- a dielectric layer between the first electrodes and the second electrode,
- wherein each of the first electrodes includes a first element, a second element, and nitrogen (N),
- a degree of stiffness of a first nitride material including the first element is higher than a degree of stiffness of a second nitride material including the second element,
- each of the first electrodes includes a region in which a concentration of the first element in the region gradually decreases and/or a concentration of the second element in the region gradually increases in a horizontal direction, away from a side surface of each of the first electrodes, and
- the horizontal direction is parallel to an upper surface of the lower structure.

2. The semiconductor device of claim 1, wherein
- the first element is Ti,
- the second element is Nb,
- the first nitride material including the first element is TiN, and
- the second nitride material including the second element is NbN.

3. The semiconductor device of claim 1, wherein each of the first electrodes includes:
- the region, which comprises a first region including the first element, the second element, and the nitrogen (N); and
- a second region not including the second element, and including the first nitride material including the first element.

4. The semiconductor device of claim 3, wherein
- each of the first electrodes further includes a third region,
- in each of the first electrodes, the first region is between the second region and the third region, and
- the third region does not include the second element, and includes the first nitride material including the first element.

5. The semiconductor device of claim 3, wherein the second region includes a lower portion below the first region, and an upper portion on a sidewall of the first region and extending upward from an edge region of the lower portion.

6. The semiconductor device of claim 1,
- wherein the lower structure includes:
  - a semiconductor substrate;
  - an isolation region defining active regions and on the semiconductor substrate;
  - gate structures in gate trenches intersecting the active regions and extending into the isolation region;

first source/drain regions and second source/drain regions in the active regions;
bit lines intersecting the gate structures and electrically connected to the first source/drain regions; and
contact structures electrically connected to the second source/drain regions and on the second source/drain regions, and
wherein the first electrodes are in contact with and electrically connected to pad portions of the contact structures.

7. The semiconductor device of claim 1,
wherein the lower structure includes:
a substrate;
bit lines on the substrate;
first source/drain regions on the bit lines;
second source/drain regions on the first source/drain regions;
channel regions between the first source/drain regions and the second source/drain regions;
gate structures on at least one side of each of the channel regions; and
contact structures on the second source/drain regions, and
wherein the first electrodes are electrically connected to the contact structures and on the contact structures.

8. The semiconductor device of claim 1, further comprising:
at least one supporter layer having an opening,
wherein the at least one supporter layer and the first electrodes are in contact with each other,
the second electrode is on the at least one supporter layer and the first electrodes, and
the dielectric layer is between the second electrode and the at least one supporter layer and between the second electrode and the first electrodes.

9. A semiconductor device comprising:
a lower structure;
a first electrode on the lower structure;
a second electrode on the first electrode; and
a dielectric layer between the first electrode and the second electrode,
wherein the first electrode includes a first region including at least a titanium (Ti) element, a niobium (Nb) element, and a nitrogen (N) element, and
in the first region of the first electrode, a concentration of the Nb element gradually increases in a horizontal direction, away from a side surface of the first electrode.

10. The semiconductor device of claim 9, wherein
the first electrode further includes a second region between the first region and the side surface of the first electrode, and
the second region does not include the Nb element, and includes the Ti element and the N element.

11. The semiconductor device of claim 10, wherein
the first electrode further includes a third region,
the first region is between the second region and the third region, and
the third region does not include the Nb element, and includes the Ti element and the N element.

12. The semiconductor device of claim 10, wherein
the second region includes a lower portion and an upper portion on a sidewall of the first region and extending upward from an edge region of the lower portion, and
the dielectric layer includes a portion in contact with an upper surface of the first region and an upper surface of the second region.

13. The semiconductor device of claim 9,
wherein the first region includes:
a first sub-region in which first TiN layers and first NbN layers are alternately stacked in the horizontal direction; and
a second sub-region in which second TiN layers and second NbN layers are alternately stacked in the horizontal direction,
wherein each of the first TiN layers has a first horizontal thickness,
wherein each of the first NbN layers has a second horizontal thickness smaller than the first horizontal thickness,
wherein each of the second NbN layers has a third horizontal thickness greater than the second horizontal thickness, and
wherein the first TiN layers and the second TiN layers have substantially equal horizontal thicknesses.

14. The semiconductor device of claim 13, wherein
the first region further includes a third sub-region in which third TiN layers and third NbN layers are alternately stacked in the horizontal direction, and
the third NbN layers have a fourth horizontal thickness greater than the second horizontal thickness.

15. The semiconductor device of claim 9, wherein
the first electrode further includes a second region that does not include the Nb element, and includes the Ti element and the N element, and
the first region is between the second region and the side surface of the first electrode.

16. A semiconductor device comprising:
a lower structure;
a first electrode on the lower structure;
a second electrode on the first electrode; and
a dielectric layer between the first electrode and the second electrode,
wherein the first electrode includes a first region including at least three elements,
the first region of the first electrode includes a first sub-region and a second sub-region, wherein the first sub-region is between, in a horizontal direction, the second sub-region and a side surface of the first electrode,
the first sub-region includes first layers and second layers alternately stacked in the horizontal direction,
the second sub-region includes third layers and fourth layers alternately stacked in the horizontal direction,
the first layers and the third layers include a same first material,
the second layers and the fourth layers include a same second material, and
a horizontal thickness of each of the second layers is smaller than a horizontal thickness of each of the fourth layers.

17. The semiconductor device of claim 16, wherein the first material is TiN, and the second material is NbN.

18. The semiconductor device of claim 16, wherein
the first region of the first electrode further includes a third sub-region,
the second sub-region is between the first sub-region and the third sub-region; and
the third sub-region includes fifth layers and sixth layers alternately stacked in the horizontal direction,
the fifth layers include the first material,
the sixth layers include the second material, and
a horizontal thickness of each of the sixth layers is greater than a horizontal thickness of each of the fourth layers.

19. The semiconductor device of claim 16, wherein the first electrode further includes a second region, the second region is between the side surface of the first electrode and the first region, and the second region does not include the second material, and includes the first material.

20. The semiconductor device of claim 1 wherein, the concentration of the first element in the region gradually decreases and/or the concentration of the second element in the region gradually increases in the horizontal direction, away from the side surface of each of the first electrodes up to a central region between the side surface and a second side surface, wherein the concentration of the first element in the region gradually increases and/or the concentration of the second element in the region gradually decreases in the horizontal direction, from the central region toward the second side surface.

* * * * *